(12) United States Patent
Kaneko et al.

(10) Patent No.: US 10,662,531 B2
(45) Date of Patent: May 26, 2020

(54) PLASMA PROCESSING APPARATUS, ABNORMALITY DETERMINATION METHOD, AND MICROWAVE GENERATOR

(71) Applicant: TOKYO ELECTRON LIMITED, Tokyo (JP)

(72) Inventors: Kazushi Kaneko, Miyagi (JP); Yunosuke Hashimoto, Miyagi (JP); Yohei Ishida, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 890 days.

(21) Appl. No.: 14/588,114

(22) Filed: Dec. 31, 2014

(65) Prior Publication Data

US 2015/0194292 A1    Jul. 9, 2015

(30) Foreign Application Priority Data

Jan. 6, 2014  (JP) .................... 2014-000464

(51) Int. Cl.
*C23C 16/511* (2006.01)
*G01R 23/02* (2006.01)
(Continued)

(52) U.S. Cl.
CPC ............ *C23C 16/511* (2013.01); *G01R 23/02* (2013.01); *H01J 37/32192* (2013.01);
(Continued)

(58) Field of Classification Search
USPC .............. 118/723 MW, 723 ME, 723 MR; 156/345.35, 345.41, 345.42
See application file for complete search history.

(56) References Cited

U.S. PATENT DOCUMENTS

| 5,300,901 A * | 4/1994 | Krummel ................ H01J 37/32 331/96 |
| 2004/0011465 A1* | 1/2004 | Matsumoto ....... H01J 37/32192 156/345.41 |

(Continued)

FOREIGN PATENT DOCUMENTS

| JP | 5-144381 A | 6/1993 |
| JP | 5-299024 A | 11/1993 |

(Continued)

*Primary Examiner* — Rakesh K Dhingra
(74) *Attorney, Agent, or Firm* — Rothwell, Figg, Ernst & Manbeck, P.C.

(57) ABSTRACT

Disclosed is a plasma processing apparatus including a processing container, a plasma generation mechanism, a regulation unit, a detection unit, and a determination unit. The plasma generation mechanism includes a microwave oscillator, and generates plasma within the processing container using microwaves oscillated by the microwave oscillator. The regulation unit regulates an oscillation frequency, which corresponds to a frequency of the microwaves oscillated by the microwave oscillator, to a predetermined frequency. The detection unit detects the oscillation frequency regulated to the predetermined frequency by the regulation unit. The determination unit determines the success/failure of regulation of the oscillation frequency by the regulation unit, using the oscillation frequency detected by the detection unit, or using a parameter which is changed depending on a difference between the oscillation frequency and the predetermined frequency.

20 Claims, 19 Drawing Sheets

(51) Int. Cl.
*H01J 37/32* (2006.01)
*H03L 7/26* (2006.01)
(52) U.S. Cl.
CPC .. *H01J 37/32201* (2013.01); *H01J 37/32302* (2013.01); *H01J 37/32311* (2013.01); *H03L 7/26* (2013.01)

(56) References Cited

U.S. PATENT DOCUMENTS

| | | | | |
|---|---|---|---|---|
| 2004/0097089 | A1* | 5/2004 | Ohmi | H01J 37/32192 |
| | | | | 438/706 |
| 2006/0124244 | A1* | 6/2006 | Ishii | H01J 37/32192 |
| | | | | 156/345.42 |
| 2009/0105980 | A1* | 4/2009 | Tetsuka | H01J 37/32082 |
| | | | | 702/76 |
| 2010/0175713 | A1* | 7/2010 | Fukiage | C23C 16/4405 |
| | | | | 134/1.1 |

FOREIGN PATENT DOCUMENTS

| | | | |
|---|---|---|---|
| JP | 2002-43848 | A | 2/2002 |
| JP | 2006-94214 | A | 4/2006 |
| JP | 2007-228219 | A | 9/2007 |
| JP | 4528870 | B1 | 8/2010 |
| JP | 2010-283678 | A | 12/2010 |
| KR | 2003-0096288 | A | 12/2003 |
| WO | 2004/068917 | A1 | 8/2004 |
| WO | 2013/125260 | A1 | 8/2013 |
| WO | 2013/146655 | A1 | 10/2013 |

* cited by examiner

PLASMA PROCESSING APPARATUS, ABNORMALITY DETERMINATION METHOD, AND MICROWAVE GENERATOR

CROSS-REFERENCE TO RELATED APPLICATIONS

This application is based on and claims priority from Japanese Patent Application No. 2014-000464, filed on Jan. 6, 2014 with the Japan Patent Office, the disclosure of which is incorporated herein in its entirety by reference.

TECHNICAL FIELD

Various aspects and exemplary embodiments discussed herein relate to a plasma processing apparatus, an abnormality determination method, and a microwave generator.

BACKGROUND

There is a plasma processing apparatus that excites plasma within a processing container using a microwave oscillator configured to oscillate microwaves. As for the microwave oscillator, a magnetron, which is inexpensive and is capable of oscillating high-power microwaves, is frequently used.

However, the frequency of microwaves oscillated by the microwave oscillator (hereinafter, referred to as an "oscillation frequency") may be changed from a desired target frequency due to various factors. For example, the microwave oscillator is a mechanically machined product. Thus, the oscillation frequency may be changed from a desired frequency due to a mechanical error existing among a plurality of microwave oscillators. In addition, since the microwave oscillator has a frequency dependency on an output power, the oscillation frequency may be changed depending on a magnitude of the output power. Sometimes, the oscillation frequency may be changed from a desired frequency due to aged deterioration of the microwave oscillator.

To this end, techniques for regulating an oscillation frequency changed from a desired frequency are variously reviewed. For example, there is a technique in which an impedance generator is provided at a rear end of a microwave oscillator to change an impedance applied to the microwave oscillator, thereby regulating an oscillation frequency to a desired frequency. There is another technique in which a reference signal is introduced into a microwave oscillator to fix the oscillation frequency of the microwave oscillator to the frequency reference signal which has a frequency equal to the desired frequency and a power lower than the output power of the microwave oscillator. See, for example, International Publication WO 2004/068917, Japanese Patent Laid-Open Publication No. 2007-228219, Japanese Patent Laid-Open Publication No. 2002-43848, Japanese Patent Laid-Open Publication No. 2006-94214, Japanese Patent Laid-Open Publication H5-144381, Japanese Patent Laid-Open Publication H5-299024, Japanese Patent No. 4528870, and International Publication WO 2013/125260.

SUMMARY

According to an exemplary embodiment, a plasma processing apparatus disclosed herein includes: a processing container; a plasma generation mechanism including a microwave oscillator, and configured to generate plasma within the processing container using microwaves oscillated by the microwave oscillator; a regulation unit configured to regulate an oscillation frequency, which corresponds to a frequency of the microwaves oscillated by the microwave oscillator, to a predetermined frequency; a detection unit configured to detect the oscillation frequency regulated to the predetermined frequency by the regulation unit; and a determination unit configured to determine success/failure of regulation of the oscillation frequency by the regulation unit, using the oscillation frequency detected by the detection unit or using a parameter which is changed depending on a difference between the oscillation frequency and the predetermined frequency.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
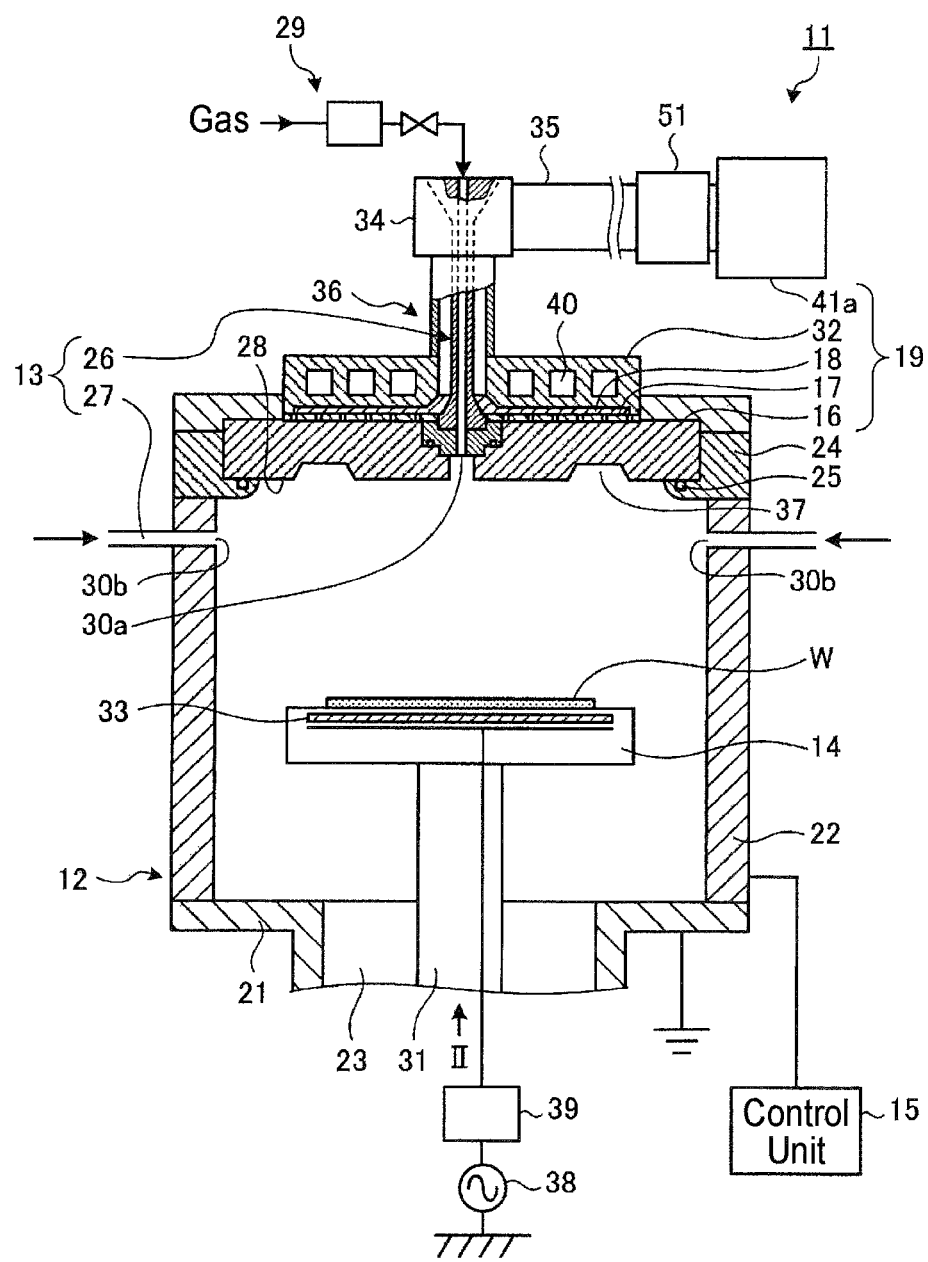
FIG. 1 is a schematic cross-sectional view illustrating a main portion of a plasma processing apparatus according to a first exemplary embodiment.

In the following detailed description, reference is made to the accompanying drawing, which form a part hereof. The illustrative embodiments described in the detailed description, drawing, and claims are not meant to be limiting. Other exemplary embodiments may be utilized, and other changes may be made, without departing from the spirit or scope of the subject matter presented here.

In the prior art techniques described above, properly determining the success/failure of regulation of an oscillation frequency is not considered.

That is, in the prior art technique that changes the impedance applied to the microwave oscillator using an impedance generator, it is likely that the oscillation frequency has not been correctly regulated to the desired frequency since there is a limit in the regulation range of frequency by the impedance generator. In the prior art technique that introduces a reference signal into the microwave oscillator, a frequency existing in a predetermined frequency band centered on a central frequency of the reference signal is fixed to the frequency of the reference signal. However, when the oscillation frequency exists outside the frequency band, the oscillation frequency is not regulated to the desired frequency. Thus, when the regulation of the oscillation frequency regulation is performed through the change of the impedance or the introduction of the reference signal in a plasma processing apparatus, it is requested to properly determine the success/failure of regulation of the oscillation frequency.

According to an exemplary embodiment, a plasma processing apparatus disclosed herein includes: a processing container; a plasma generation mechanism including a microwave oscillator, and configured to generate plasma within the processing container using microwaves oscillated by the microwave oscillator; a regulation unit configured to regulate an oscillation frequency, which corresponds to a frequency of the microwaves oscillated by the microwave oscillator, to a predetermined frequency; a detection unit configured to detect the oscillation frequency regulated to the predetermined frequency by the regulation unit; and a determination unit configured to determine success/failure of regulation of the oscillation frequency by the regulation unit, using the oscillation frequency detected by the detection unit, or using a parameter which is changed depending on a difference between the oscillation frequency and the predetermined frequency.

In an exemplary embodiment, the plasma processing apparatus disclosed herein further includes an impedance generator including a movable member, and configured to generate an impedance to be applied to the microwave oscillator depending on a set movable amount of the movable member. The regulation unit regulates the oscillation frequency to the predetermined frequency by setting the movable amount of the movable member, which reduces the difference between the oscillation frequency detected by the detection unit and the predetermined frequency, in the impedance generator. When the oscillation frequency detected by the detection unit exists in a predetermined frequency band centered on the predetermined frequency, the determination unit determines that the regulation of the oscillation frequency by the regulation unit has been successful, and when the oscillation frequency detected by the detection unit does not exist in the predetermined frequency band centered on the predetermined frequency, the determination unit determines that the regulation of the oscillation frequency by the regulation unit has not been successful.

In an exemplary embodiment, the plasma processing apparatus further includes an impedance generator including a movable member, and configured to generate an impedance to be applied to the microwave oscillator depending on a set movable amount of the movable member. The regulation unit regulates the oscillation frequency to the predetermined frequency by setting the movable amount of the movable member, which reduces the difference between the oscillation frequency detected by the detection unit and the predetermined frequency, in the impedance generator. When the movable amount of the movable member, which is set in the impedance generator as the parameter by the regulation unit, exists in a previously allowed range, the determination unit determines that the regulation of the oscillation frequency by the regulation unit has been successful, and when the movable amount of the movable member, which is set in the impedance generator as the parameter by the regulation unit, does not exist in the previously allowed range, the determination unit determines that the regulation of the oscillation frequency by the regulation unit has not been successful.

In an exemplary embodiment, the plasma processing apparatus disclosed herein further includes an introduction unit configured to introduce a signal, which has a frequency equal to the oscillation frequency and a power lower than a power of the microwaves oscillated by the microwave oscillator, into the microwave oscillator.

According to an exemplary embodiment, in the plasma processing apparatus disclosed herein, the regulation unit includes a reference signal generator configured to generate a reference signal which has the predetermined frequency and a power lower than a power of the microwaves oscillated by the microwave oscillator. The regulation unit regulates the oscillation frequency to the predetermined frequency by introducing the reference signal generated by the reference signal generator into the microwave oscillator.

According to an exemplary embodiment, in the plasma processing apparatus disclosed herein, the detection unit includes a spectrum level detector configured to detect an intensity distribution of branched microwaves obtained when the microwaves are branched by the microwave oscillator in relation to a frequency of the branched microwaves, and detects a frequency corresponding to a maximum value in the intensity distribution as the oscillation frequency. The determination unit determines the success/failure of regulation of the oscillation frequency by the regulation unit using the oscillation frequency detected by the detection unit. The determination unit also determines an abnormal oscillation of the microwave oscillator by calculating differences between the maximum value in the intensity distribution detected by the detection unit and peripheral values corresponding to opposite ends of a predetermined frequency band centered on a frequency corresponding to the maximum value, and using values of the calculated differences.

In an exemplary embodiment, the plasma processing apparatus disclosed herein further includes: a notification unit configured to make a notification of a determination result by the determination unit.

In an exemplary embodiment, an abnormality determination method disclosed herein is performed using a plasma processing apparatus including a processing container, a plasma generation mechanism including a microwave oscillator and configured to generate plasma within the processing container using the microwaves oscillated by the microwave oscillator, and a regulation unit configured to regulate an oscillation frequency, which corresponds to a frequency of the microwaves oscillated by the microwave oscillator, to a predetermined frequency. The abnormality determination method includes: detecting the oscillation frequency regulated to the predetermined frequency by the regulation unit; and determining success/failure of regulation of the oscillation frequency by the regulation unit, using the oscillation frequency detected by the detection unit, or using a parameter which is changed depending on a difference between the oscillation frequency and the predetermined frequency.

Further, in an exemplary embodiment, a microwave generator disclosed herein includes: a microwave oscillator configured to oscillate microwaves; a regulation unit configured to regulate an oscillation frequency, which corresponds to a frequency of the microwaves oscillated by the microwave oscillator, to a predetermined frequency; a detection unit configured to detect the oscillation frequency regulated to the predetermined frequency by the regulation unit; and a determination unit configured to determine the success/failure of regulation of the oscillation frequency by the regulation unit, using the oscillation frequency detected by the detection unit or using a parameter which is changed depending on a difference between the oscillation frequency and the predetermined frequency.

According to an aspect of the plasma processing apparatus disclosed herein the success/failure of regulation of an oscillation frequency may be determined.

Hereinafter, the exemplary embodiments of the plasma processing apparatus, the abnormality determination method, and the microwave generator will be described in detail with reference to the accompanying drawings. However, the present disclosure is not limited by the exemplary embodiments. Respective exemplary embodiments may be properly combined with each other as long as the combination is not contradictory to processing contents.

First Exemplary Embodiment

Figure 2:
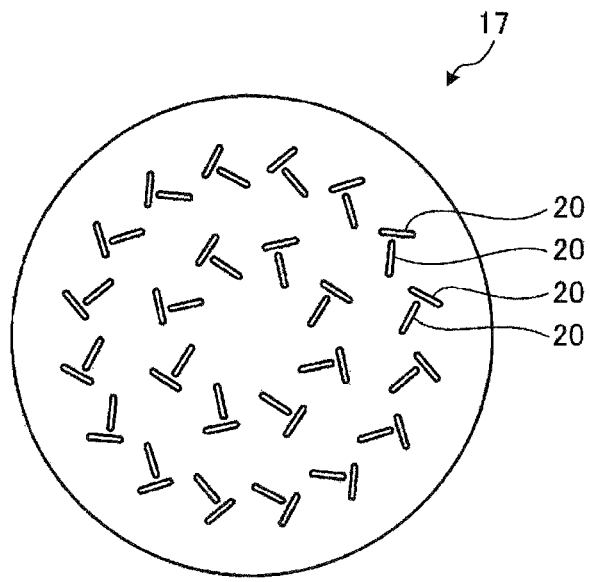
FIG. 2 is a view illustrating a slot antenna plate included in the plasma processing apparatus illustrated in FIG. 1 when the slot antenna is viewed from a lower side, i.e. in a direction indicated by arrow II in FIG. 1.

FIG. 1 is a schematic cross-sectional view illustrating a main portion of a plasma processing apparatus according to a first exemplary embodiment. FIG. 2 is a view illustrating a slot antenna plate included in the plasma processing apparatus illustrated in FIG. 1 when the slot antenna is viewed from a lower side, i.e. in a direction indicated by arrow II in FIG. 1. Meanwhile, in FIG. 1, hatching of some members is omitted from the view point of easy understanding. In addition, in the present exemplary embodiment, the vertical direction in FIG. 1, which is the direction indicated by arrow II or the opposite direction in FIG. 1, is assumed as the vertical direction of the plasma processing apparatus.

Referring to FIGS. 1 and 2, the plasma processing apparatus 11 performs a processing on a processing target substrate W which is an object to be processed, using plasma. Specifically, a processing such as, for example, etching, CVD, or sputtering, is performed. As the processing target substrate W, a silicon substrate used for manufacturing a semiconductor element may be exemplified.

The plasma processing apparatus 11 includes: a processing container 12 configured to perform therein a processing on the processing target substrate W using plasma; a gas supply unit 13 configured to supply a gas for plasma excitation or a gas for plasma processing into the processing container 12; a disc-shaped holding table 14 installed within the processing container 12 and configured to hold the processing target substrate W thereon; a plasma generation mechanism 19 configured to generate plasma within the processing container 12 using microwaves; and a control unit 15 configured to control the operation of the entire plasma processing apparatus 11. The control unit 15 performs a control on the entire plasma processing apparatus 11. For example, the control unit 14 controls a gas flow rate in the gas supply unit 13 and a pressure within the processing container 12.

The processing container 12 includes a bottom 21 positioned below the holding table 14, and a side wall 22 extending upwardly from an outer circumference of the bottom 21. The side wall 22 has a substantially cylindrical shape. An exhaust hole 23 is formed through a portion of the bottom 21 of the processing container 12. The top side of the processing container 12 is opened, and the processing container 12 is configured to be capable of being sealed by a lid unit 24 disposed on the top side of the processing container 12, a dielectric window 16 to be described later, and an O-ring 25 interposed between the dielectric window 16 and the lid unit 24 to serve as a seal member.

The gas supply unit 13 includes: a first gas supply unit 26 configured to supply a gas toward a center of the processing target substrate W through a first flow path; and a second gas supply unit 27 configured to supply a gas from the outside of processing target substrate W through a second flow path. A gas supply hole 30a communicated with the first flow path in the first gas supply unit 26 to supply a gas is formed at a position which corresponds to the radial center of the dielectric window 16 and is retreated to the inside of the dielectric window 16 from the bottom surface 28 of the dielectric window 16 which serves as a facing surface facing the holding table 14. The first gas supply unit 26 supplies an inert gas for plasma excitation or a gas for plasma processing while regulating, for example, a flow rate by a gas supply system 29 connected to the first gas supply unit 26. The second gas supply unit 27 is formed in an upper portion of the side wall 22 by providing a plurality of gas supply holes 30b configured to supply the inert gas for plasma excitation or the gas for plasma processing into the processing container 12. The plurality of gas supply holes 30b is formed at regular intervals in the circumferential direction. The same inert gas for plasma excitation or the same gas for plasma processing is supplied to the first gas supply unit 26 and the second gas supply unit 27 from the same gas supply source. Meanwhile, according to a request or control contents, different gases may be supplied to the first gas supply unit 26 and the second gas supply unit 27, and for example, the flow rate ratio thereof may be regulated.

In the holding table 14, a high frequency power supply 38 for radio frequency (RF) bias is electrically connected to an electrode within the holding table 14 via a matching unit 39. The high frequency power supply 38 may output, for example, a high frequency wave of 13.56 MHz with a predetermined power (bias power). The matching unit 39 accommodates a matcher configured to match an impedance of the high frequency power supply 38 side with an impedance of the load side such as mainly the electrode, plasma, the processing container 12, and a blocking capacitor for self-bias generation is included in the matcher. Meanwhile, in a plasma processing, the supply of the bias voltage to the holding table 14 may be performed or not, as necessary.

The holding table 14 is capable of holding the processing target substrate W thereon by an electrostatic chuck (not illustrated). In addition, the holding table 14 includes a temperature regulation mechanism 33 provided therein such as, for example, a heater (not illustrated) for heating, and may be set to a desired temperature by the temperature regulation mechanism 33. The holding table 14 is supported by a cylindrical support 31 which extends vertically upwardly from the lower side of the bottom 21. The abovementioned exhaust hole 23 is formed at the center of the bottom 21 of the processing container 12, and the cylindrical support 31 extends through the exhaust hole 23. An exhaust apparatus (not illustrated) is connected to the lower side of the annular exhaust hole 23 through an exhaust pipe (not illustrated). The exhaust apparatus includes a vacuum pump such as, for example, a turbo molecular pump. By the exhaust apparatus, the inside of the processing container 12 may be decompressed to a predetermined pressure.

The plasma generation mechanism 19 includes a microwave generator 41a provided outside of the processing container 12 and configured to generate microwaves for plasma excitation. In addition, the plasma generation mechanism 19 includes a dielectric window 16 disposed in the upper portion of the processing container 12 at a position facing the holding table 14 and configured to introduce the microwaves generated by the microwave generator 41a into the processing container 12. In addition, the plasma generation mechanism 19 includes a slot antenna plate 17 disposed above the dielectric window 16 and including a plurality of slot holes configured to radiate the microwaves to the dielectric window 16. Further, the plasma generation mechanism 19 includes a dielectric member 18 disposed on the upward side of the slot antenna plate 17. The dielectric member 18 functions to propagate the microwaves introduced by a coaxial waveguide 36 to be described later in the radial direction, and to delay the microwaves.

The microwave generator 41a is connected to the upper portion of the coaxial waveguide 36 configured to introduce microwaves, through a 4E tuner 51, a waveguide 35, and a mode converter 34. For example, TE mode microwaves generated by the microwave generator 41a pass the waveguide 35 through the 4E tuner 51 and are converted into a TEM mode by mode converter 34 to be propagated through the coaxial waveguide 36. The 4E tuner 51 is impedancematched with respect to a load 50 and prevents reflected waves from being input to the microwave generator 41a. A specific configuration of the microwave generator 41a will be described later. Meanwhile, the waveguide side in relation to the microwave generator 41a becomes the load side to be described later.

The dielectric window 16 has substantially a disc shape and is formed of a dielectric material. On a portion of the bottom surface 28 of the dielectric window 16, an annular concave portion 37 recessed in a taper shape or a concave portion recessed in a circular shape is formed so as to facilitate generation of standing waves by the introduced microwaves. With the concave portion 37, plasma may be efficiently generated by microwaves at the lower side of the dielectric window 16. Meanwhile, as a specific material of the dielectric window 16, for example, quartz or alumina may be used.

The slot antenna plate 17 has a thin disc shape. As illustrated in FIG. 2, the plurality of slot holes 20 is formed such that each two slot holes 20 form one pair in which the two slots are orthogonal to each other with a predetermined interval therebetween. A plurality of slot hole 20 pairs is formed to be spaced apart from each other in the circumferential direction. The plurality of slot hole 20 pairs is formed to be spaced apart from each other in the radial direction, as well.

The microwaves generated by the microwave generator 41a are propagated to the dielectric member 18 through the coaxial waveguide 36. The microwaves are radially diffused toward the radial outside within the dielectric member 18 sandwiched between a cooling jacket 32 and the slot antenna plate 17, and radiated from the plurality of slot holes 20 formed in the slot antenna plate 17 to the dielectric window 16. The cooling jacket 32 includes therein a circulation path 40 configured to circulate a cooling medium and is configured to cool, for example, the slot antenna plate 17, the dielectric window 16, and the dielectric member 18 so as to perform temperature regulation. The microwaves which have passed through the dielectric window 16 generate an electric field just below the dielectric window 16 to generate plasma within the processing container 12.

When microwave plasma is generated in the plasma processing apparatus 11, a so-called plasma generation region where the electron temperature of plasma is relatively high is formed just below the bottom surface 28 of the dielectric window 16, more specifically, in a region positioned about several cm below the bottom surface 28 of the dielectric window 16. Further, in a region positioned below the plasma generation region, a so-called plasma diffusion region is formed in which the plasma generated in the plasma generation region is diffused. The plasma diffusion region is a region where the electron temperature of plasma is relatively low and a plasma processing is performed. As such, so-called plasma damage is not caused on the processing target substrate W during the plasma processing, and due to the high electron density of the plasma, the plasma processing may be efficiently performed.

Figure 3:
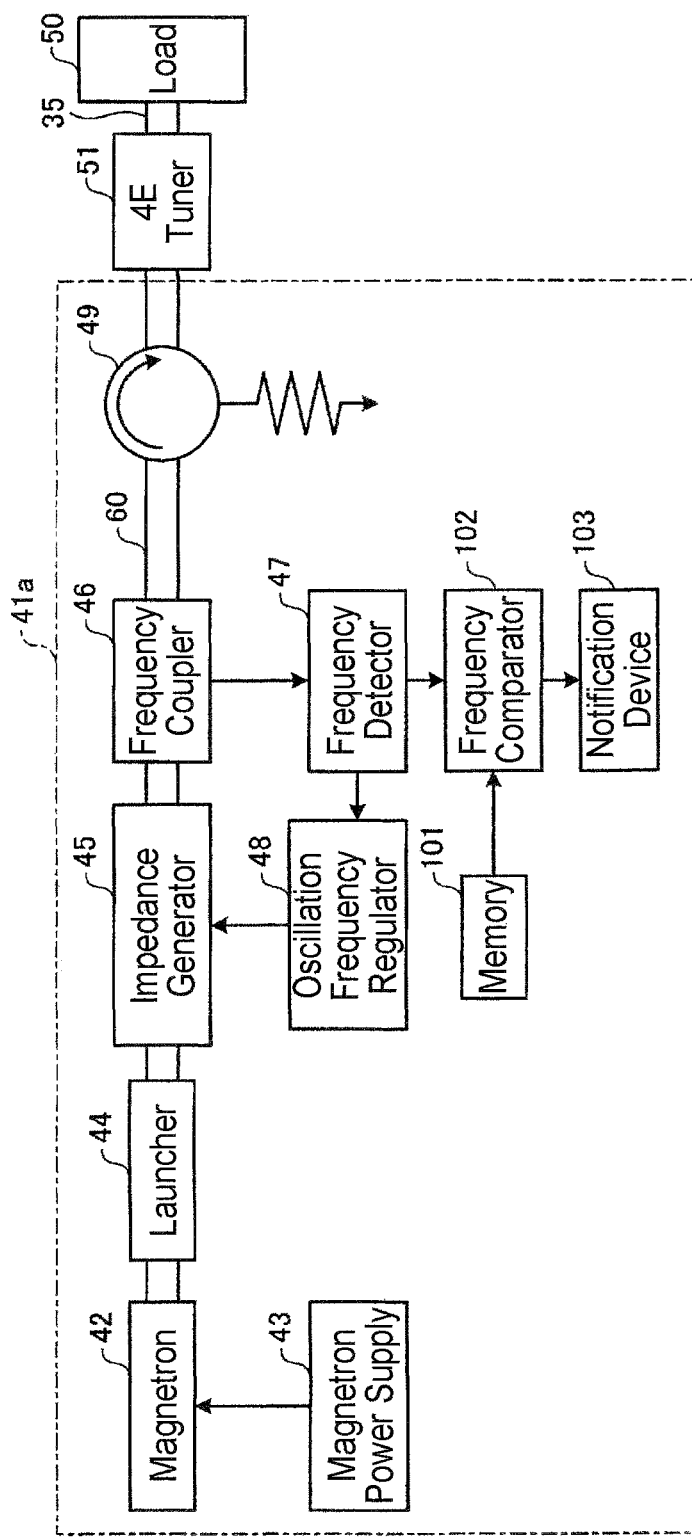
FIG. 3 is a block diagram illustrating a configuration of a microwave generator according to the first exemplary embodiment.

Next, descriptions will be made on a specific configuration of a microwave generator 41a included in the plasma generation mechanism 19 provided in the plasma processing apparatus 11 with the configuration described above. FIG. 3 is a block diagram illustrating a configuration of a microwave generator according to a first exemplary embodiment.

As illustrated in FIG. 3, the microwave generator 41a includes a magnetron 42, a magnetron power supply 43, a launcher 44, an impedance generator 45, a frequency coupler 46, a frequency detector 47, an oscillation frequency regulator 48, and a circulator 49. In addition, the microwave generator 41a includes a memory 101, a frequency comparator 102, and a notification device 103.

The magnetron 42 oscillates microwaves serving as high frequency waves according to a voltage supplied from the magnetron power supply 43. The magnetron 42 is an example of a microwave oscillator that oscillates microwaves. Here, the frequency of the microwaves oscillated by the magnetron 42 (hereinafter, referred to as an "oscillation frequency") may be changed from a target desired frequency (hereinafter, referred to as "target frequency") due to various factors. For example, since the magnetron 42 is a mechanically machined product, the oscillation frequency may be changed from the target frequency due to a mechanical error among a plurality of magnetrons 42. In addition, since the magnetron 42 has a frequency dependency with respect to an output power, the oscillation frequency may be changed from the target frequency by the magnitude of the output power. Further, the oscillation frequency may be changed from the target frequency due to aged deterioration of the magnetron 42.

Figure 4:
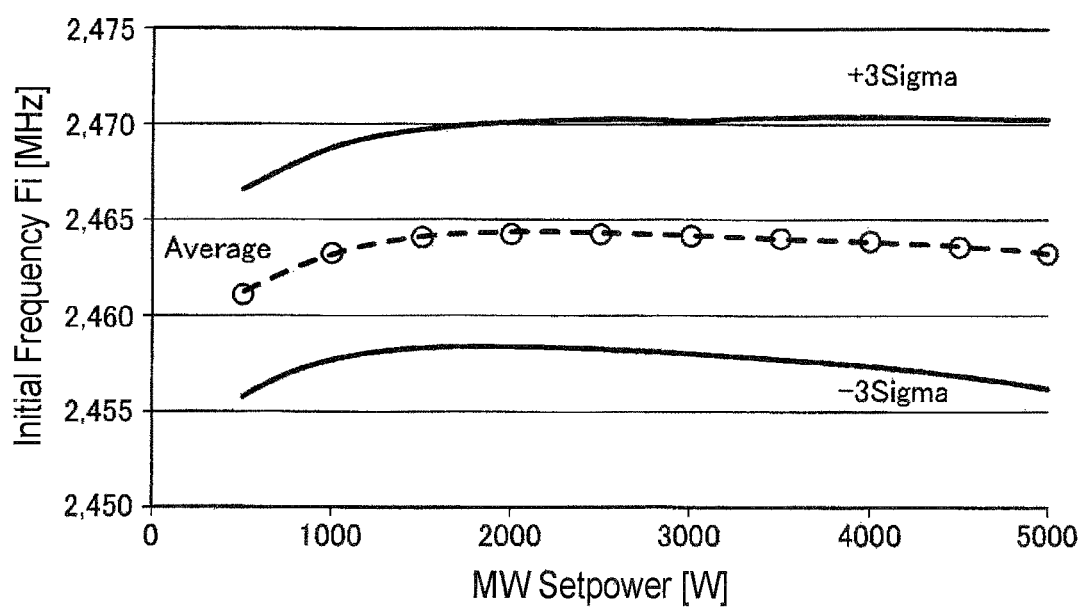
FIG. 4 is a view for describing a change of oscillation frequency due to a mechanical error and an output power.

FIG. 4 is a view for describing a change of an oscillation frequency due to a mechanical error and an output power. In FIG. 4, the horizontal axis represents an output power [W] of the magnetron 42, and the vertical axis represents an initial frequency Fi [MHz] which is the oscillation frequency of a new magnetron 42. In addition, in FIG. 4, "Average" and "±3 Sigma" respectively refer to the average value and the standard deviation of initial frequencies corresponding to 100 new magnetrons 42 (i.e., n equals to 100). In addition, in the example of FIG. 4, the impedance applied to the magnetrons 42 is set to a value corresponding to a VSWR (Voltage Standing Wave Ratio) of 1.5 and a standing wave phase of 0.4 λg. As exemplified in FIG. 4, the oscillation frequencies of magnetrons 42 are changed within a range of ±15 MHz by a mechanical error among the plurality of magnetrons 42. That is, due to the mechanical error among the plurality of magnetrons 42, the oscillation frequencies of the magnetrons 42 are likely to be changed from the target frequency. In addition, as exemplified in FIG. 4, the oscillation frequencies of the magnetrons 42 are changed in a range of ±3 MHz by the output powers of the magnetrons 42. That is, the oscillation frequencies of the magnetrons 42 are likely to be changed by the output powers of the target frequency magnetrons 42.

Figure 5:
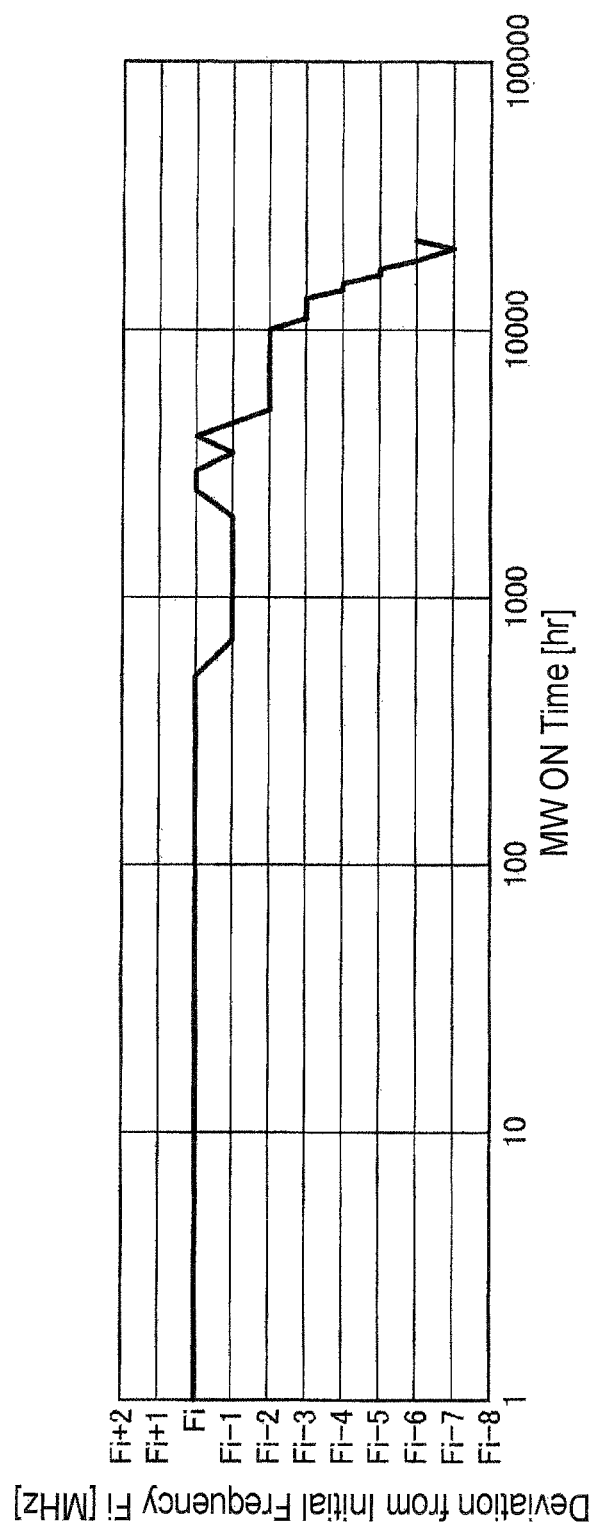
FIG. 5 is a view for describing a variation of an oscillation frequency due to aged deterioration.

FIG. 5 is a view for describing a change of an oscillation frequency due to aged deterioration. In FIG. 5, the horizontal axis represents a used time [hr] of a magnetron 42, and the vertical axis represents a deviation [MHz] from an initial frequency Fi. As illustrated in FIG. 5, the oscillation frequency of the magnetron 42 is reduced as the used time of the magnetron 42 increases. That is, the oscillation frequency is likely to be changed from the target frequency due to the aged deterioration of the magnetron 42.

Descriptions will be made returning back to FIG. 3. The magnetron power supply 43 supplies a voltage used for oscillating microwaves to the magnetron 42.

The launcher 44 transmits the microwaves oscillated by the magnetron 42 to a waveguide 60 at the rear end side of the magnetron 42.

The impedance generator 45 is provided in the waveguide 60 at the rear end side of the magnetron 42 and generates an impedance applied to the magnetron 42. Specifically, the impedance generator 45 includes a waveguide and at least one metal rod (stub) which may protrude from a tube wall of the waveguide to the inside of the tube. When the protruding position of the stub is changed in relation to a reference position, the impedance applied to the magnetron 42 is generated. The stub is an example of a movable member, and the protrusion position of the stub in relation to the reference position is an example of a movable amount of the movable member. In addition, the impedance generated by the impedance generator 45 is controlled by an oscillation frequency regulator 48 to be described later. That is, the impedance generator 45 generates the impedance applied to the magnetron 42 according to the protrusion position of the stub which is set from the oscillation frequency regulator 48.

Figure 6:
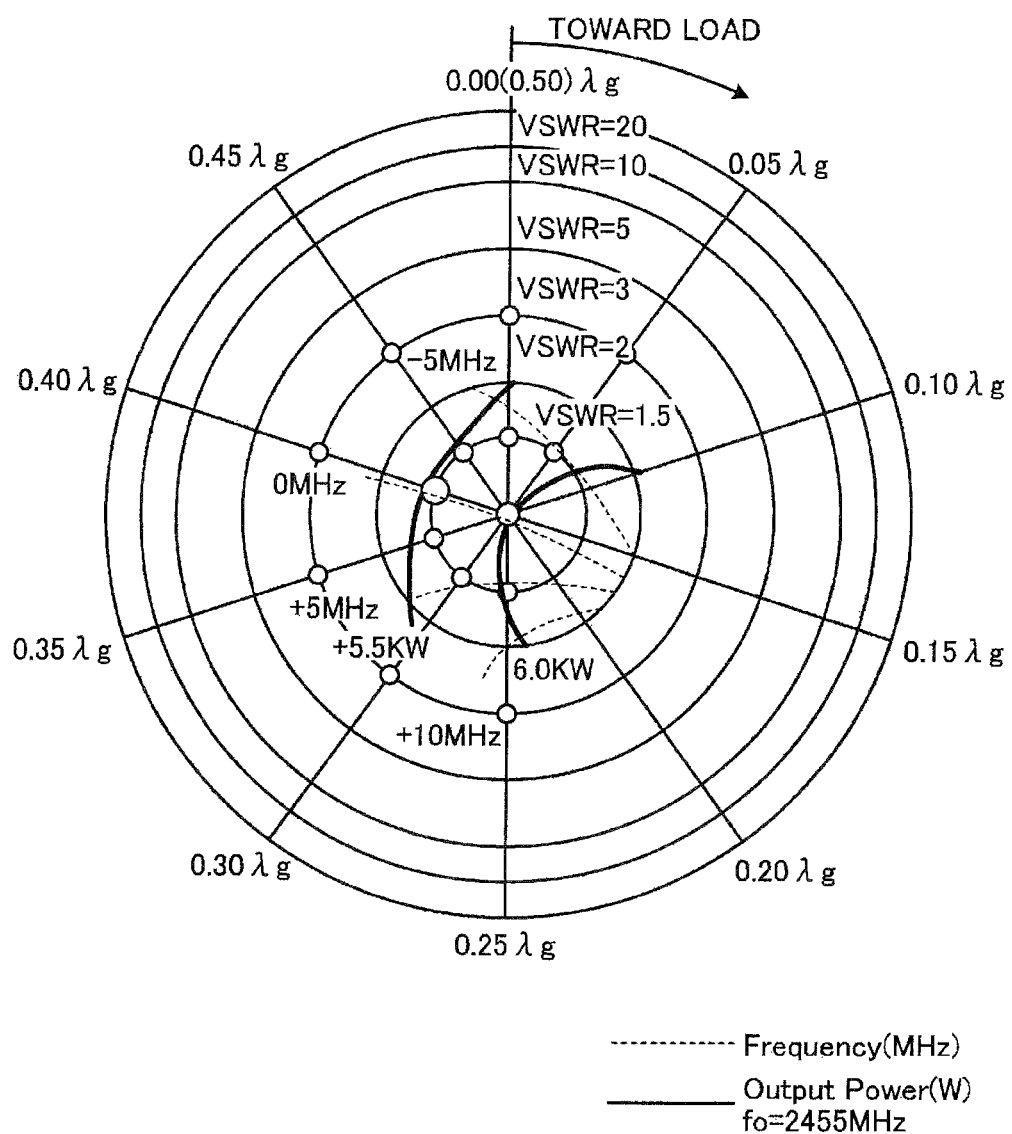
FIG. 6 is a Rieke diagram illustrating an operating characteristic of a magnetron in the first exemplary embodiment.

Here, descriptions will be made on a relationship between the impedance applied to the magnetron 42 and the oscillation frequency of the magnetron 42. FIG. 6 is a Rieke diagram illustrating an operating characteristic of a magnetron in the first exemplary embodiment. The Rieke diagram illustrated in FIG. 6 is a diagram in which output powers and oscillation frequencies of a magnetron 42 are indicated in contour line shapes on an impedance diagram expressed by polar coordinates. In FIG. 6, a radial coordinate represents a VSWR, and a circumferential coordinate represents a phase of a standing wave. As exemplified in FIG. 6, when an impedance applied to a magnetron 42, i.e. a VSWR and a phase of a standing wave is changed, the oscillation frequency of the magnetron 42 is changed. This phenomenon is referred to as a "pulling phenomenon". The impedance generator 45 of the present embodiment changes the oscillation frequency of the magnetron 42 using the pulling phenomenon.

Descriptions will be made returning back to FIG. 3. The frequency coupler 46 is connected to an output terminal of the impedance generator 45, branches microwaves traveling within the waveguide 60 from the impedance generator 45 toward the load 50 side, and outputs branched microwaves of one side (hereinafter, "branched microwaves") to the frequency detector 47 and branched microwaves of the other side to the circulator 49. Here, the load 50 includes, for example, a mode converter 34, a coaxial waveguide 36, and a processing container 12 positioned at the downstream side of the waveguide 35.

The frequency detector 47 detects an oscillation frequency regulated to the target frequency by the oscillation frequency regulator 48 to be described later. Specifically, the frequency detector 47 analyzes the branched microwaves input to the frequency coupler 46 and detects the frequency of the analyzed branched microwaves as the oscillation frequency regulated to the target frequency by the oscillation frequency regulator 48. At the time point when the regulation of the oscillation frequency is performed by the oscillation frequency regulator 48, it is likely that the protrusion position of the stub, which is set in the impedance generator 45, reaches an upper limit position or a lower limit position, and it is likely that the oscillation frequency of the magnetron 42 has not been regulated correctly to the target frequency. In addition, the frequency detector 47 outputs the detected oscillation frequency to the oscillation frequency regulator 48 and the frequency comparator 102. The frequency detector 47 is an example of a detection unit that detects an oscillation frequency regulated to a predetermined frequency.

The oscillation frequency regulator 48 regulates the oscillation frequency of the magnetron 42 to the target frequency. Specifically, the oscillation frequency regulator 48 calculates a difference between the oscillation frequency input from the frequency detector 47 and the target frequency, and sets the protrusion position of the stub, which reduces the calculated difference, in the impedance generator 45 so as to regulate the oscillation frequency of the magnetron 42 to the target frequency.

Figure 7:
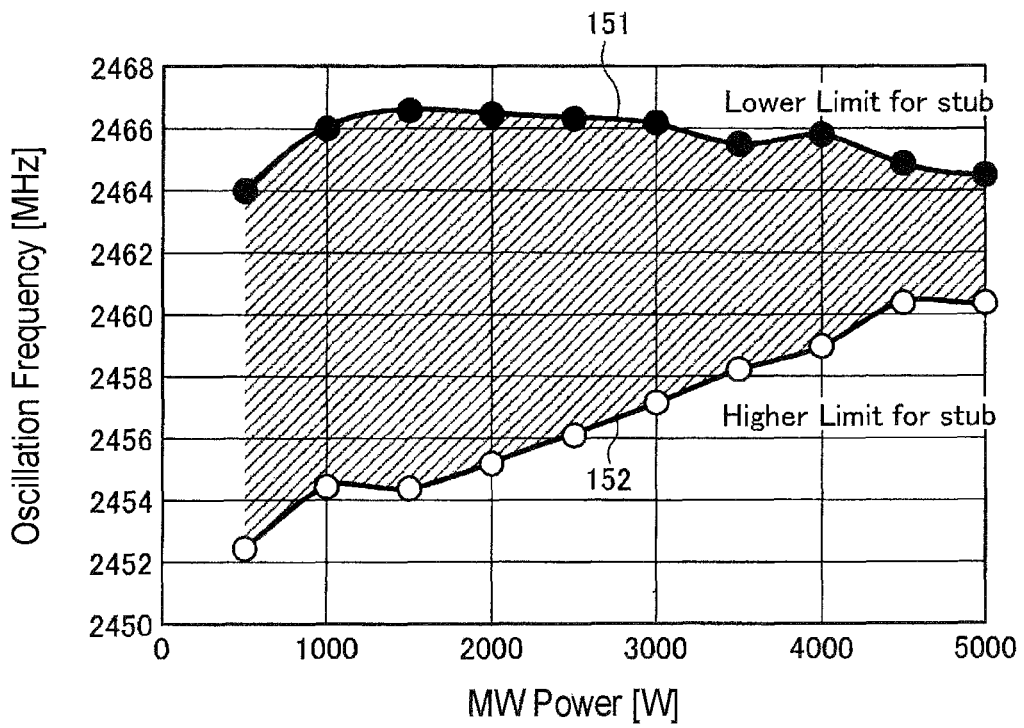
FIG. 7 is a view (part 1) for describing an example of a relationship between a protrusion position of a stub which is set in an impedance generator and a regulation range of an oscillation frequency of a magnetron in the first exemplary embodiment.

Here, descriptions will be made on an example of a relationship between a protrusion position of a stub which is set in the regulation range impedance generator 45 and a regulation range of the oscillation frequency of the magnetron 42. FIG. 7 is a view (part 1) for describing an example of a relationship between the protrusion position of the stub which is set in the impedance generator and a regulation range of the oscillation frequency of the magnetron 42 in the first exemplary embodiment. In FIG. 7, the horizontal axis represents an output power [W] of the magnetron 42 and the vertical axis represents an oscillation frequency [MHz] of the magnetron 42. In addition, the graph 151 represents an oscillation frequency of the magnetron 42 when the protrusion position of the stub which is set in the impedance generator 45 is the lower limit position (e.g., 0 mm). In addition, the graph 152 represents an oscillation frequency of the magnetron 42 when the protrusion position of the stub which is set in the impedance generator 45 is the upper limit position (e.g., 20 mm). As illustrated in FIG. 7, when the protrusion position of the stub which is set in the impedance generator 45 is changed between the lower limit position (e.g., 0 mm) and the upper limit position (e.g., 20 mm), the oscillation frequency of the magnetron 42 for each output power is regulated in a range interposed between the graphs 151 and 152.

Figure 8:
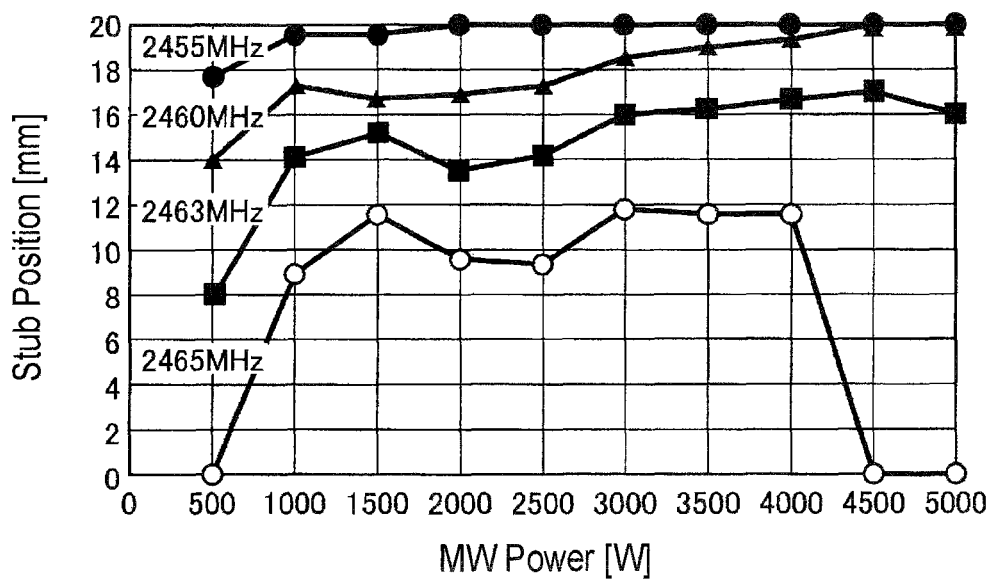
FIG. 8 is view (part 2) for describing an example of a relationship between a protrusion position of a stub which is set in the impedance generator and a regulation range of an oscillation frequency of a magnetron in the first exemplary embodiment.

FIG. 8 is a view (part 2) for describing an example of a relationship between a protrusion position of a stub which is set in an impedance generator and an oscillation frequency regulation range of a magnetron in the first exemplary embodiment. In FIG. 8, the horizontal axis represents an output power [W] of the magnetron 42, and the vertical axis represents a protrusion position [nm] of the stub which is set in the impedance generator 45. In addition, in the example of FIG. 8, it is assumed that the lower limit of the protrusion position of the stub which is set in the impedance generator 45 is 0 [mm], and the upper limit of the protrusion position of the stub which is set in the impedance generator 45 is 20 [mm]. In addition, FIG. 8 also represents an oscillation frequency [MHz] of the magnetron 42. As illustrated in FIG. 8, when the oscillation frequency of the magnetron 42 is regulated to 2463 [MHz], the protrusion position of the stub which is set in the impedance generator 45 is accommodated in the range from the lower limit position to the upper limit position even if the output power of the magnetron 42 is changed.

Whereas, in the case where the oscillation frequency of the magnetron 42 is regulated to 2460 [MHz], when the output power of the magnetron 42 is changed to 4500 [W] or more, the protrusion position of the stub which is set in the impedance generator 45 reaches the upper limit position. In addition, in the case where the oscillation frequency of the magnetron 42 is regulated to 2455 [MHz], when the output power of the magnetron 42 is changed to 2000 [W] or more, the protrusion position of the stub which is set in the impedance generator 45 reaches the upper limit position. In addition, in the case where the oscillation frequency of the magnetron 42 is regulated to 2465 [MHz], when the output power of the magnetron 42 is changed to 500 [W] or less or 4500 [W] or more, the protrusion of the stub which is set in the impedance generator 45 reaches the lower limit position. That is, as can be seen from the example of FIG. 8, in the case where the protrusion position of the stub which is set in the impedance generator 45 reaches the upper limit position or the lower limit position, it is likely that the regulation of the oscillation frequency of the magnetron has not been successful. In other words, in the case where the protrusion position of the stub which is set in the impedance generator 45 reaches the upper limit position or the lower limit position, it is likely that the oscillation frequency of the magnetron 42 has not been regulated to the target frequency.

Descriptions will be made returning back to FIG. 3. The circulator 49 transmits the microwaves input from the frequency coupler 46 to the load 50 side through the waveguide 35, and causes the microwaves reflected from the load 50 side to be adsorbed to a dummy load.

The memory 101 stores a frequency band for determination which is used for determining the success/failure of regulation of the oscillation frequency of the magnetron 42. The frequency band for determination refers to a predetermined frequency band centered on the target frequency. The frequency band for determination in the present exemplary embodiment is included in the change range of the oscillation frequency of the magnetron 42 which may be changed by changing the protrusion position of the stub which is set in the impedance generator 45. For example, it is assumed that the relationship between the protrusion position of the stub which is set in the impedance generator 45 and the regulation range of the oscillation frequency of the magnetron 42 corresponds to that illustrated in FIG. 7. In this case, the frequency band for determination is included in a range interposed between the graphs 151 and 152.

The frequency comparator 102 determines the success/failure of regulation of the oscillation frequency by the oscillation frequency regulator 48 by comparing the oscillation frequency detected by the frequency detector 47 and the frequency band for determination which is stored in the memory 101 with each other. Specifically, the frequency comparator 102 determines whether the oscillation frequency input from the frequency detector 47 exists within the frequency band for determination which is stored in the memory 101. When the oscillation frequency input from the frequency detector 47 exists in the frequency band for determination, the protrusion of the stub which is set in the impedance generator 45 from the oscillation frequency regulator 48 is included between the lower limit position and the upper limit position. Thus, when the oscillation frequency input from the frequency detector 47 exists in the frequency band for determination, the frequency comparator 102 determines that the regulation of the oscillation frequency by the oscillation frequency regulator 48 has been successful. Meanwhile, when the oscillation frequency input from the frequency detector 47 does not exist in the frequency band for determination, the protrusion position of the stub which is set in the impedance generator 45 from the oscillation frequency regulator 48 reaches the lower limit position or the upper limit position. Thus, the frequency comparator 102 determines that the regulation of the oscillation frequency by the oscillation frequency regulator 48 has not been successful. Subsequently, the frequency comparator 102 outputs the determination result to a notification device 103. The frequency comparator 102 is an example of a determination unit that determines the success/failure of regulation of an oscillation frequency using a detected oscillation frequency.

The notification device 103 makes a notification of the determination result by the frequency comparator 102. For example, the notification device 103 makes a notification of the determination result using, for example, a sound, light and a vibration.

Figure 9:
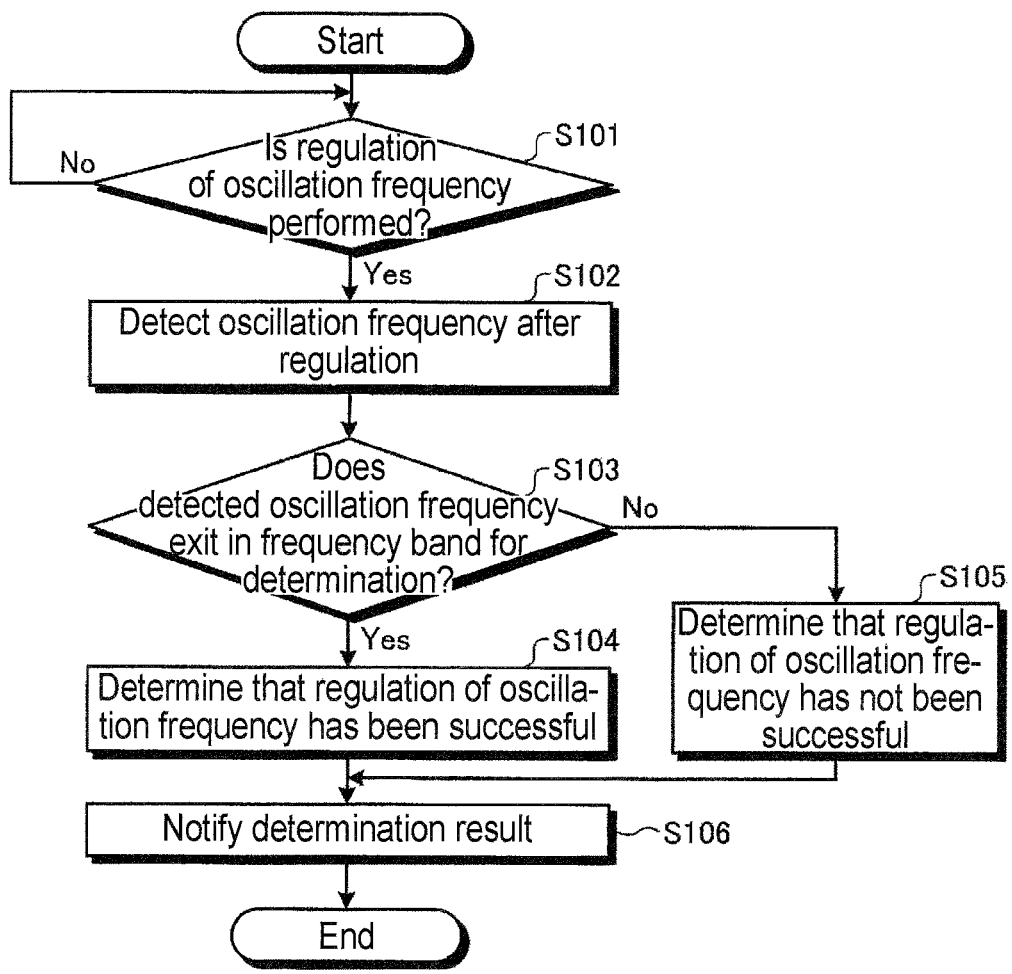
FIG. 9 is a flowchart illustrating a flow of a process of determining the success/failure of regulation of an oscillation frequency according to the first exemplary embodiment.

Next, descriptions will be made on a process of determining the success/failure of regulation of an oscillation frequency according to a first exemplary embodiment. FIG. 9 is a flowchart illustrating a flow of a process of determining the success/failure of regulation of an oscillation frequency according to the first exemplary embodiment.

As illustrated in FIG. 9, when the regulation of an oscillation frequency is performed by the oscillation frequency regulator 48 (step S101; Yes), the oscillation regulation detector 47 detects the oscillation frequency regulated to the target frequency by the oscillation frequency regulator 48 (step S102). At the time point when the regulation of the oscillation frequency is performed by the oscillation frequency regulator 48, it is likely that the protrusion position of the impedance generator 45 reaches the upper limit position or the lower limit position, and it is likely that the oscillation frequency of the magnetron 42 has not been regulated correctly to the target frequency.

The frequency comparator 102 determines whether the oscillation frequency detected by the frequency detector 47 exists in the frequency band for determination which is stored in the memory 101 (step S103). When the oscillation frequency exists in the frequency band for determination (step S103; Yes), since the protrusion position of the stub which is set in the impedance generator 45 is included between the lower limit position and the upper limit position, the frequency comparator 102 determines that the regulation of the oscillation frequency by the oscillation frequency regulator 48 has been successful (step S104).

Meanwhile, when the detected oscillation frequency does not exist in the frequency band for determination (step S103; No), since the protrusion position of the stub which is set in the impedance generator 45 reaches the lower limit position or the upper limit position, the frequency comparator 102 determines that the regulation of the oscillation frequency by the oscillation frequency regulator 48 has not been successful (step S105).

The notification device 103 makes a notification of the determination result by the frequency comparator 102 (step S106).

As described above, when the oscillation frequency of the magnetron 42 is regulated to the target frequency, the plasma processing apparatus 11 of the first exemplary embodiment detects the oscillation frequency after regulation, and determines the success/failure of regulation of the oscillation frequency using the detected oscillation frequency. Thus, when the oscillation frequency changed from the target frequency is regulated, the plasma processing apparatus 11 may determine whether the oscillation frequency has been regulated correctly to the target frequency. As a result, according to the first exemplary embodiment, the success/failure of regulation of the oscillation frequency may be properly determined.

In addition, the plasma processing apparatus 11 of the first exemplary embodiment sets the protrusion position of the stub, which reduces the difference between the detected oscillation frequency and the target frequency, in the impedance generator 45 to perform the regulation of the oscillation frequency. In addition, when the detected oscillation frequency exists in a predetermined frequency band centered on the target frequency, the plasma processing apparatus 11 determines that the regulation of the oscillation frequency using the impedance generator 45 has been successful. Meanwhile, when the detected oscillation frequency does not exist in the predetermined frequency band centered on the target frequency, the plasma processing apparatus 11 determines that the regulation of the oscillation frequency using the impedance generator 45 has not been successful. As a result, according to the first exemplary embodiment, when the regulation of the oscillation frequency is performed by changing the impedance using the impedance generator, the success/failure of regulation of the oscillation frequency may be properly determined.

Second Exemplary Embodiment

In the first exemplary embodiment, when the oscillation frequency of the magnetron 42 is regulated to the target frequency using the impedance generator 45, the success/failure of regulation of the oscillation frequency is determined using the detection result of the oscillation frequency after regulation. However, the success/failure of regulation of the oscillation frequency may be determined using a parameter which is changed depending on a difference between the detection result of the oscillation frequency after regulation and the target frequency. Thus, in the second exemplary embodiment, descriptions will be made on an example in which the success/failure of regulation of the oscillation frequency is determined using a parameter which is changed depending on a difference between the detection result of the oscillation frequency after regulation and the target frequency. In the following description, the components which are the same as those of the first exemplary embodiment will be denoted with the same symbols and descriptions thereof will be omitted.

Figure 10:
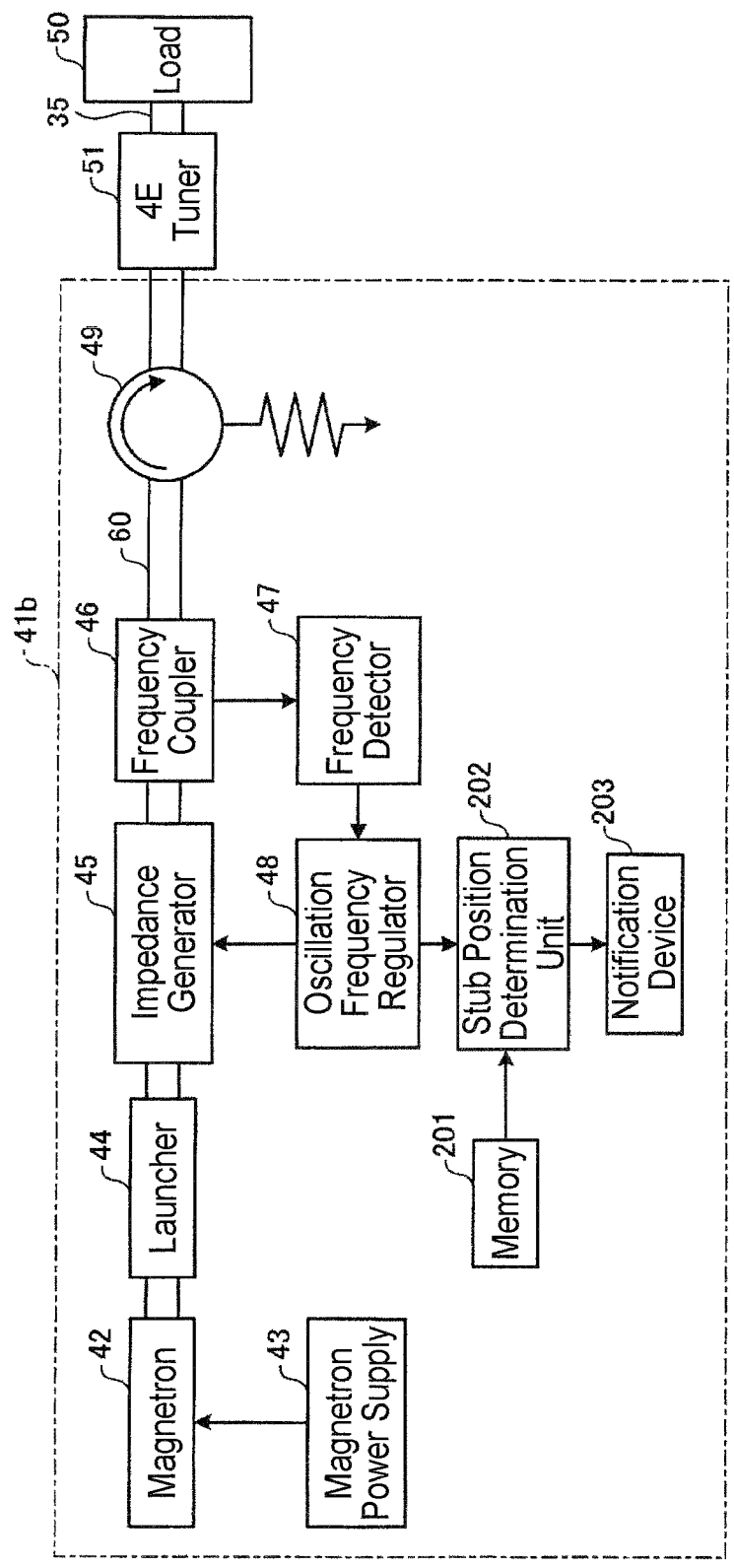
FIG. 10 is a block diagram illustrating a configuration of a microwave generator according to a second exemplary embodiment.

FIG. 10 is a block diagram illustrating a configuration of a microwave generator according to the second exemplary embodiment. The microwave generator 41b illustrated in FIG. 10 includes a memory 201, a stub position determination device 202, and a notification device 203, instead of the memory 101, the frequency comparator 102, and the notification device 103 which are illustrated in FIG. 3.

Like the frequency detector 47 illustrated in FIG. 3, the frequency detector 47 detects an oscillation frequency regulated to the target frequency by the oscillation frequency regulator 48. Specifically, the frequency detector 47 analyzes branched microwaves input from the frequency coupler 46, and detects the frequency of the analyzed branched microwaves as the oscillation frequency regulated to the target frequency by the oscillation frequency regulator 48. In addition, the frequency detector 47 outputs the detected oscillation frequency to the oscillation frequency regulator 48.

Like the oscillation frequency regulator 48 illustrated in FIG. 3, the oscillation frequency regulator 48 regulates the oscillation frequency of the magnetron 42 to the target frequency. Specifically, the oscillation frequency regulator 48 calculates a difference between the oscillation frequency input from the frequency detector 47 and the target frequency, and sets the protrusion position of the stub, which reduces the calculated difference, in the impedance generator 45 so as to regulate the oscillation frequency of the magnetron 42 to the target frequency. In addition, the oscillation frequency regulator 48 outputs the protrusion position of the stub, which is set in the impedance generator 45, to the stub position determination device 202. The protrusion position of the stub, which is set in the impedance generator 45 by the oscillation frequency regulator 48, is an example of the parameter which is changed depending on the difference between the detected oscillation frequency and a predetermined frequency.

The memory 201 stores a positional range for determination which is used for determining the success/failure of regulation of the oscillation frequency of the magnetron 42. The positional range for determination refers to a range allowed in advance for the protrusion position of the stub, which is set in the impedance generator 45, that is, the range from the upper limit position to the lower limit position of the protrusion position of the stub. For example, the positional range for determination is set to a range of 0 [mm] to 20 [mm].

The stub position determination device 202 compares the protrusion position of the stub, which is set in the impedance generator 45 by the oscillation frequency regulator 48, and the positional range for determination, which is stored in the memory 201 with each other, so as to determine the success/failure of regulation of the oscillation frequency by the oscillation frequency regulator 48. Specifically, the stub position determination device 202 obtains the protrusion position of the stub, which is set in the impedance generator 45 by the oscillation frequency regulator 48, from the oscillation frequency regulator 48. The stub position determination device 202 determines whether the protrusion position of the stub, which is set in the impedance generator 45 by the oscillation frequency regulator 48, exists in the positional range for determination, which is stored in the memory 201. When the protrusion position of the stub, which is set in the impedance generator 45 by the oscillation frequency regulator 48, exists in the positional range for determination, the stub position determination device 202 determines that the regulation of the oscillation frequency by the oscillation frequency regulator 48 has been successful. Meanwhile, when the protrusion position of the stub, which is set in the impedance generator 45 by the oscillation frequency regulator 48, does not exist in the positional range for determination, the stub position determination device 202 determines that the regulation of the oscillation frequency by the oscillation frequency regulator 48 has not been successful. Subsequently, the stub position determination device 202 outputs the determination result to the notification device 203. The stub position determination device 202 is an example of a determination unit that determines the success/failure of regulation of the oscillation frequency using the parameter which is changed depending on a difference of a detected oscillation frequency and a predetermined frequency.

The notification device 203 makes a notification of the determination result by the stub position determination device 202. For example, the notification device 203 makes the notification of the determination result, using, for example, a sound, light, and a vibration.

Figure 11:
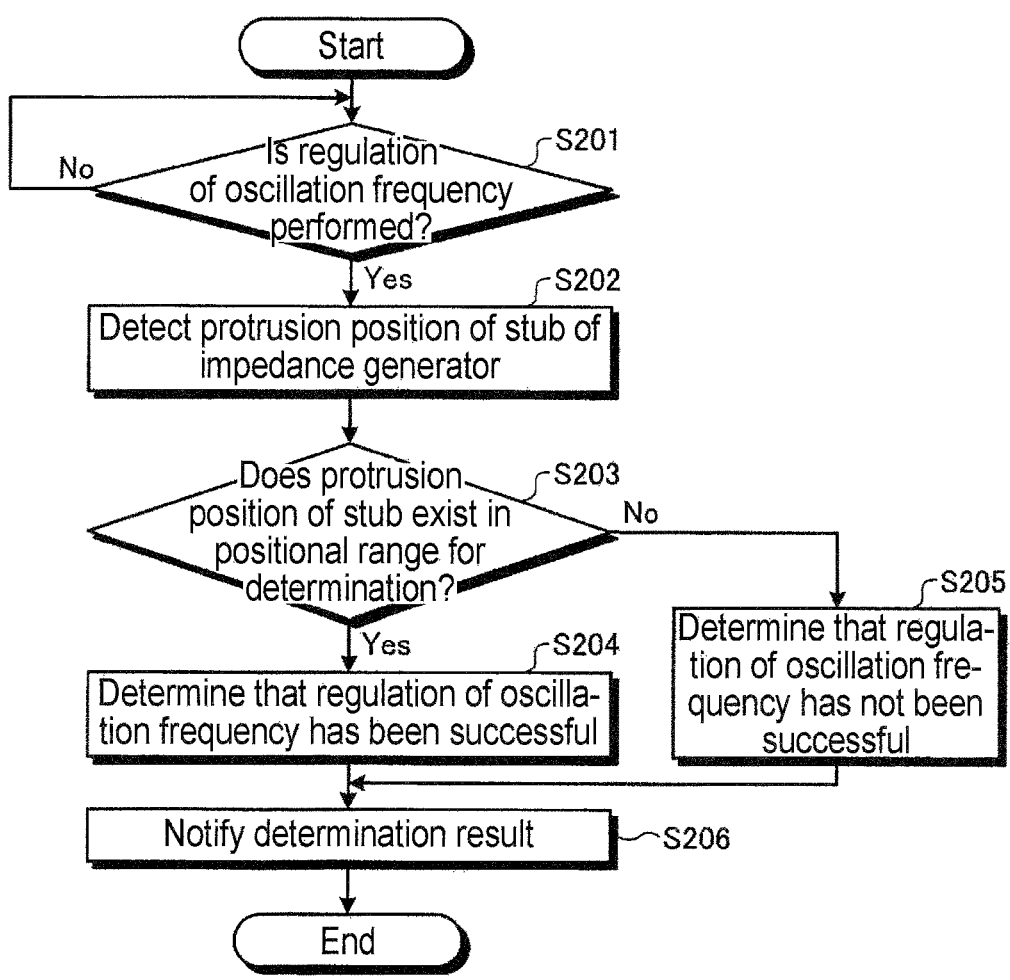
FIG. 11 is a flowchart illustrating an example of a flow of determining the success/failure of regulation of an oscillation frequency regulation according to the second exemplary embodiment.

Next, descriptions will be made on a process of determining the success/failure of regulation of the oscillation frequency according to the second exemplary embodiment. FIG. 11 is a flowchart illustrating an example of a flow of a process of determining the success/failure of regulation of an oscillation frequency according to the second exemplary embodiment.

As illustrated in FIG. 11, when the regulation of the oscillation frequency is performed by the oscillation frequency regulator 48 (step S201; Yes), the stub position determination device 202 obtains a protrusion position of a stub, which is set in the impedance generator 45, from the oscillation frequency regulator 48 (step S202).

The stub position determination device 202 determines whether the protrusion position of the stub, which is set in the impedance generator 45, exists in the positional range for determination, which is stored in the memory 201 (step S203). When the protrusion position of the stub, which is set in the impedance generator 45, exists in the positional range for determination (step S203; Yes), the stub position determination device 202 determines that the regulation of the oscillation frequency by the oscillation frequency regulator 48 has been successful (step S204).

Meanwhile, when the protrusion position of the stub, which is set in the impedance generator 45, does not exist in the positional range for determination (step S203; No), the stub position determination device 202 determines that the regulation of the oscillation frequency by the oscillation frequency regulator 48 has not been successful (step S205).

The notification device 203 makes a notification of the determination result by the stub position determination device 202 (step S206).

As described above, when the oscillation frequency of the magnetron 42 is regulated to the target frequency, the plasma processing apparatus 11 of the second exemplary embodiment determines the success/failure of regulation of the oscillation using the protrusion position of the stub, which is set in the impedance generator 45. Thus, when an oscillation frequency changed from the target frequency is regulated, the plasma processing apparatus 11 is capable of determining whether the oscillation frequency has been regulated correctly to the target frequency. As a result, according to the second exemplary embodiment, the success/failure of regulation of an oscillation frequency may be properly determined.

In addition, when the protrusion position of the stub, which is set in the impedance generator 45, exists in a previously allowed range, the plasma processing apparatus 11 of the second exemplary embodiment determines that the regulation of the oscillation frequency using the impedance generator 45 has been successful. Meanwhile, when the protrusion position of the stub, which is set in the impedance generator 45, does not exist in the previously allowed range, the plasma processing apparatus 11 determines that the regulation of the oscillation frequency using the impedance generator 45 has not been successful. As a result, according to the second exemplary embodiment, when the regulation of the oscillation frequency is performed by changing the impedance using the impedance generator, the success/failure of regulation of an oscillation frequency may be properly determined.

Third Exemplary Embodiment

In the first exemplary embodiment, in the case where the oscillation frequency of the magnetron 42 is regulated to the target frequency using the impedance generator 45, the success/failure of regulation of the oscillation frequency is determined using the detection result of the oscillation frequency after regulation. However, in a case where the oscillation frequency of the magnetron 42 is regulated to the target frequency using the impedance generator 45 while introducing a signal for arranging a waveform of microwaves into the magnetron 42, and the oscillation frequency of the magnetron 42 is regulated to the target frequency using the impedance generator 45, the success/failure of regulation of the oscillation frequency may be determined using the detection result of the oscillation frequency after regulation. Thus, in the third exemplary embodiment, descriptions will be made on an example in which the success/failure of regulation of the oscillation frequency is determined using the detection result of the oscillation frequency after regulation, in the case where the oscillation frequency of the magnetron 42 is regulated to the target frequency using the impedance generator 45 while introducing a signal for arranging a waveform of microwaves into the magnetron 42. In the following description, the components which are the same as those of the first exemplary embodiment will be denoted with the same symbols and descriptions thereof will be omitted.

Figure 12:
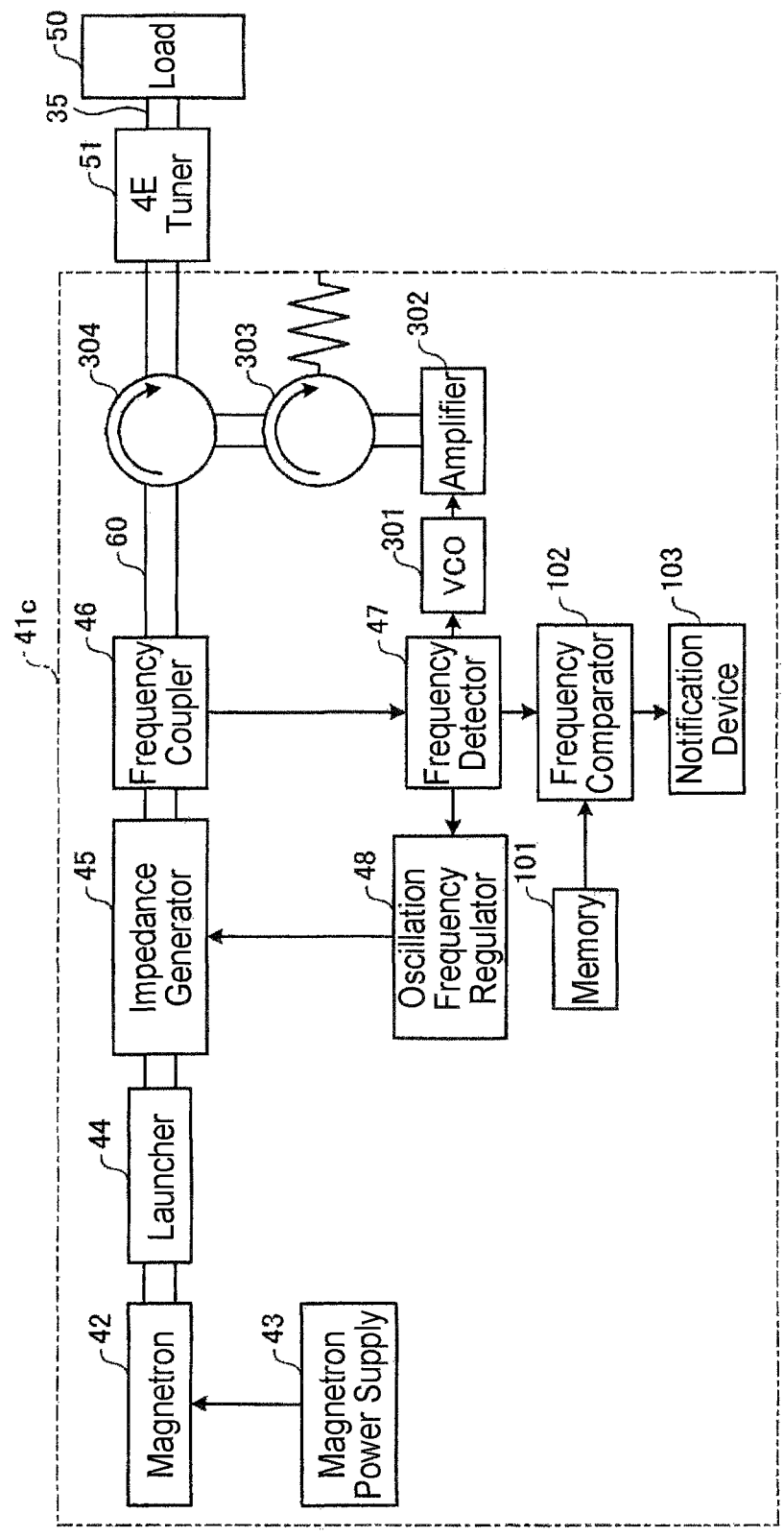
FIG. 12 is a block diagram illustrating a configuration of a microwave generator according to a third exemplary embodiment.

FIG. 12 is a block diagram illustrating a configuration of a microwave generator according to a third exemplary embodiment. The microwave generator 41c illustrated in FIG. 12 further includes a voltage controlled oscillator (VCO) 301 and an amplifier 302 in addition to the respective components illustrated in FIG. 3. In addition, the microwave generator 41c includes a circulator 303 and a circulator 304, instead of the circulator 49 illustrated in FIG. 3.

Like the frequency detector 47 illustrated in FIG. 3, the frequency detector 47 detects the oscillation frequency regulated to the target frequency by the oscillation frequency regulator 48. In addition, the frequency detector 47 outputs the detected oscillation frequency to the oscillation frequency regulator 48, the frequency comparator 102, and the VCO 301.

The VCO 301 oscillates a signal having a frequency equal to the oscillation frequency input from the frequency detector 47, and outputs the oscillated signal to the amplifier 302.

The amplifier 302 amplifies the signal input from the VCO 301 so as to generate a signal having a frequency equal to the oscillation frequency and a power lower than that of the microwaves oscillated by the magnetron 42, and outputs the generated signal to the circulator 303.

The circulator 303 transmits the signal input from the amplifier 302 (hereinafter, referred to as a "reference signal") to the circulator 304, and causes the microwaves reflected from the load 50 side to be absorbed to a dummy load.

The circulator 304 introduces the reference signal transmitted by the circulator 303 to the magnetron 42 through the waveguide 60. The waveform of the microwaves oscillated from the magnetron 42 is arranged by the reference signal introduced into the magnetron 42. The VCO 301, the amplifier 302, the circulator 303, and the circulator 304 form an example of an introduction unit that introduces a signal having a frequency equal to the oscillation frequency and a power lower than that of the microwaves oscillated by the microwave oscillator into the microwave oscillator.

As described above, the plasma processing apparatus 11 of the third exemplary embodiment determines the success/failure of regulation of the oscillation frequency using the detection result of the oscillation frequency after regulation, in the case where the oscillation frequency of the magnetron 42 is regulated to the target frequency using the impedance generator 45 while introducing a signal for arranging a waveform of microwaves into the magnetron 42. As a result, according to the third exemplary embodiment, the success/failure of regulation of the oscillation frequency may be properly determined while arranging the waveform of microwaves.

Fourth Exemplary Embodiment

In the second exemplary embodiment, in the case where the oscillation frequency of the magnetron 42 is regulated to the target frequency, the success/failure of regulation of the oscillation frequency is determined using the protrusion position of the stub, which is set in the impedance generator 45. However, in the case where the oscillation frequency of the magnetron 42 is regulated to the target frequency while introducing a signal that arranges the waveform of the microwaves into the magnetron 42, the success/failure of regulation of the oscillation frequency may be determined using the protrusion position of the stub, which is set in the impedance generator 45. Thus, in the fourth exemplary embodiment, descriptions will be made on an example in which the success/regulation of regulation of the oscillation frequency is determined using the protrusion position of the stub, which is set in the impedance generator 45, in the case where the oscillation frequency of the magnetron 42 is regulated to the target frequency while introducing a signal which arranges the waveform of microwaves into the magnetron 42. In the following description, the components which are the same as those of the second exemplary embodiment will be denoted with the same symbols and descriptions thereof will be omitted.

Figure 13:
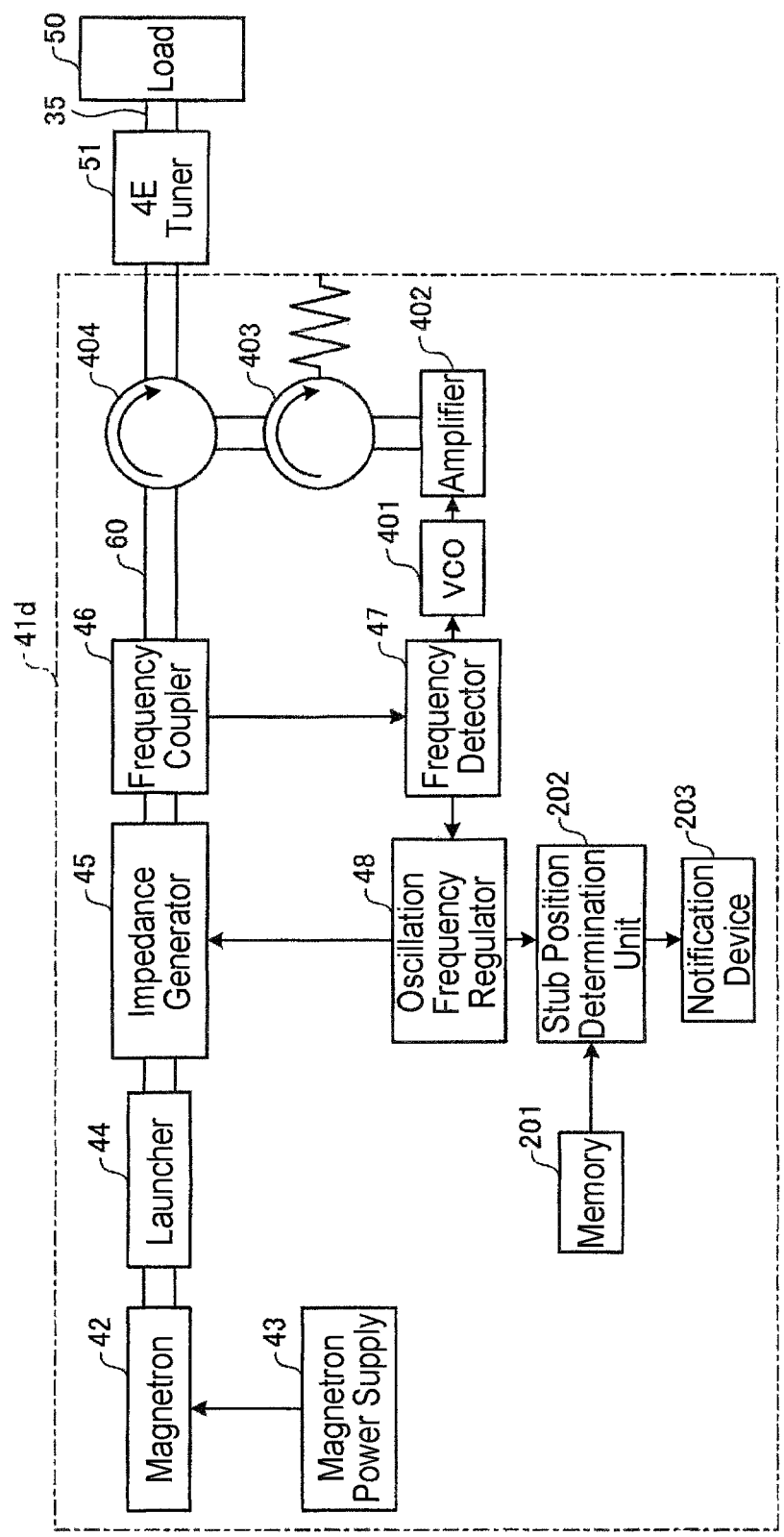
FIG. 13 is a block diagram illustrating a configuration of a microwave generator according to a fourth exemplary embodiment.

FIG. 13 is a block diagram illustrating a configuration of a microwave generator according to a fourth exemplary embodiment. The microwave generator 41d illustrated in FIG. 13 further includes a VCO 401 and an amplifier 402 in addition to the respective components illustrated in FIG. 10. In addition, the microwave generator 41d includes a circulator 403 and a circulator 404, instead of the circulator 49 illustrated in FIG. 10.

Like the frequency detector 47 illustrated in FIG. 10, the frequency detector 47 detects an oscillation frequency regulated to the target frequency by the oscillation frequency regulator 48. Specifically, the frequency detector 47 analyzes branched microwaves input from the frequency coupler 46, and detects the frequency of the analyzed branched microwaves as the oscillation frequency regulated to the target frequency by the oscillation frequency regulator 48. In addition, the frequency detector 47 outputs the detected oscillation frequency to the oscillation frequency regulator 48 and the VCO 401.

The VCO 401 oscillates a signal having a frequency equal to the oscillation frequency input from the frequency detector 47, and outputs the oscillated signal to the amplifier 402.

The amplifier 402 amplifies the signal input from the VCO 401 so as to generate a signal having a frequency equal to the oscillation frequency and a power lower than that of the microwaves oscillated by the magnetron 42, and outputs the generated signal to the circulator 403.

The circulator 403 transmits the signal input from the amplifier 402 (hereinafter, referred to as a "reference signal") to the circulator 404, and causes the microwaves reflected from the load 50 side to be absorbed to a dummy load.

The circulator 404 introduces the reference signal transmitted by the circulator 403 into the magnetron 42 through the waveguide 60. The waveform of microwaves oscillated from the magnetron 42 is arranged by the reference signal introduced into the magnetron 42. The VCO 401, the amplifier 402, the circulator 403, and the circulator 404 form an example of an introduction unit that introduces a signal having a frequency equal to the oscillation frequency and a power lower than that of the microwaves oscillated by the microwave oscillator into the microwave oscillator.

As described above, the plasma processing apparatus 11 of the fourth exemplary embodiment determines the success/failure of regulation of the oscillation frequency using the protrusion position of the stub, which is set in the impedance generator 45, in the case where the oscillation frequency of the magnetron 42 is regulated to the target frequency while introducing a signal that arranges a waveform of microwaves into the magnetron 42. As a result, according to the fourth exemplary embodiment, the success/failure of regulation of the oscillation frequency may be properly determined while arranging the waveform of microwaves.

Fifth Exemplary Embodiment

In the third exemplary embodiment, the oscillation frequency of the magnetron 42 is regulated to the target frequency using the impedance generator 45 while introducing the reference signal that arranges the waveform of the microwaves into the magnetron 42. However, the oscillation frequency of the magnetron 42 may be regulated to the target frequency by introducing a reference signal that has a frequency equal to the target frequency and arranges the waveform of the microwaves. Thus, in the fifth exemplary embodiment, descriptions will be made on an example in which the oscillation frequency of the magnetron 42 is regulated to the target frequency by introducing the reference signal that has a frequency equal to the target frequency and arranges the waveform of the microwaves. In the following description, the components which are the same as those of the third exemplary embodiment will be denoted with the same symbols and descriptions thereof will be omitted.

Figure 14:
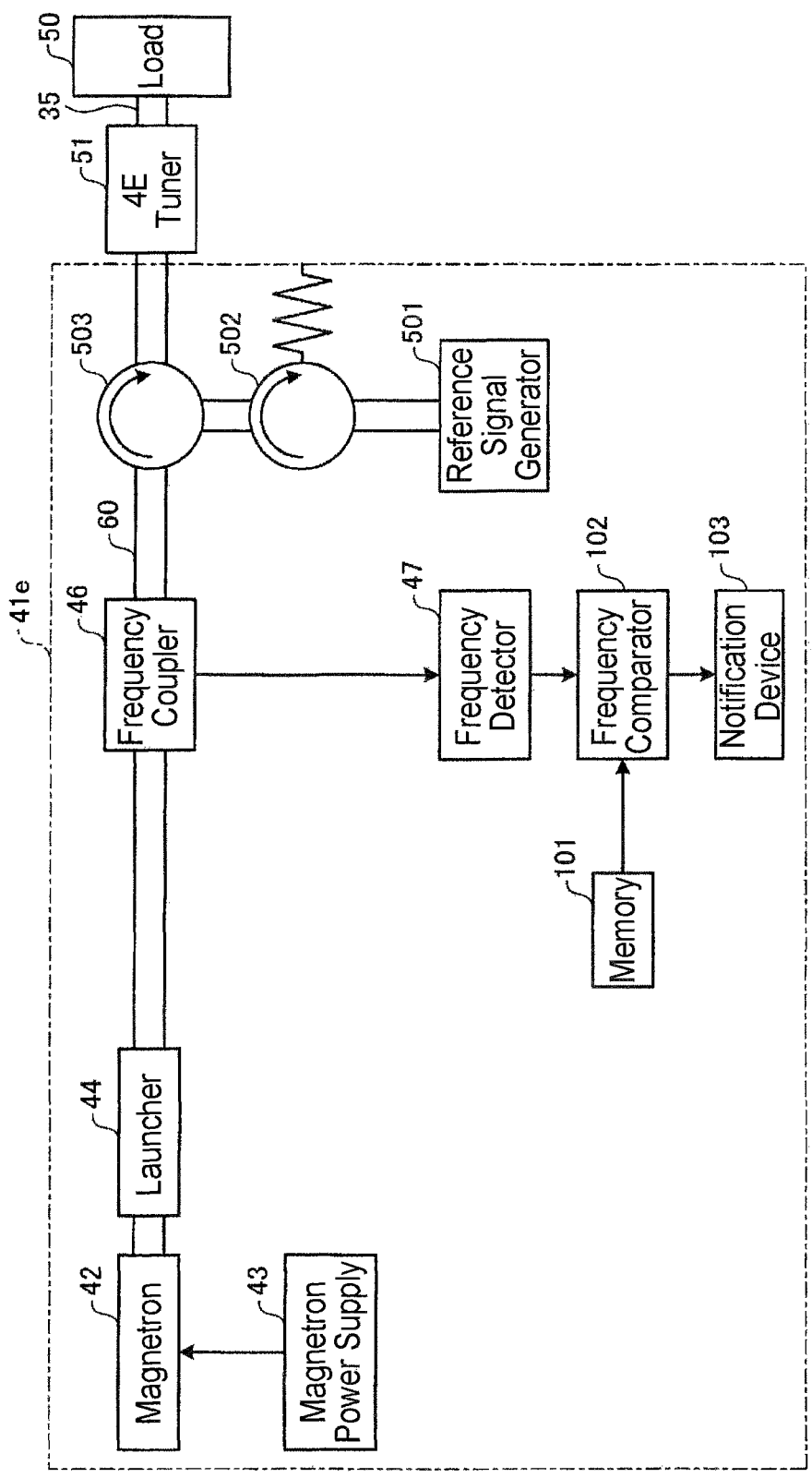
FIG. 14 is a block diagram illustrating a configuration of a microwave generator according to a fifth exemplary embodiment.

FIG. 14 is a block diagram illustrating a configuration of the microwave generator according to the fifth exemplary embodiment. The microwave generator 41e illustrated in FIG. 14 includes a reference signal generator 501, a circulator 502, and a circulator 503, instead of the VCO 301, the amplifier 302, the circulator 303, and the circulator 304 which are illustrated in FIG. 12. In addition, the microwave generator 41e does not include the impedance generator 45 illustrated in FIG. 12.

The memory 101 stores a frequency band for determination, which is used for determining the success/failure of regulation of the oscillation frequency of the magnetron 42. The frequency band for determination in the present exemplary embodiment refers to a predetermined frequency band centered on the frequency of a reference signal generated from the reference signal generator 501 to be described later.

The reference signal generator 501 generates a reference signal that has a frequency equal to the target frequency and a power lower than that of the microwaves oscillated by the magnetron 42. The reference signal generator 501 generates the reference signal by amplifying a signal stably oscillated from, for example, a quartz oscillator.

The circulator 502 transmits the reference signal generated from the reference signal generator 501 to the circulator 503 and causes the microwaves reflected from the load 50 side to be absorbed to a dummy load.

The circulator 503 introduces the reference signal transmitted by the circulator 502 into the magnetron 42 through the waveguide 60. The waveform of the microwaves oscillated from the magnetron 42 is arranged by the reference signal introduced into the magnetron 42. The frequency of the microwaves oscillated from the magnetron 42, i.e. the oscillation frequency is drawn and regulated to the target frequency which is the frequency of the reference signal introduced into the magnetron 42. The reference signal generator 501, the circulator 502, and the circulator 503 form an example of a regulation unit that regulates the oscillation frequency to a predetermined frequency by introducing the reference signal generated by the reference signal generator 501 into the magnetron 42.

As described above, the plasma processing apparatus 11 of the fifth exemplary embodiment regulates the oscillation frequency of the magnetron 42 to the target frequency by introducing the reference signal that has a frequency equal to the target frequency and arranges the waveform of the microwaves into the magnetron 42. As a result, according to the fifth exemplary embodiment, the regulation of the oscillation frequency may be performed without using the impedance regulator and the success/failure of regulation of the oscillation frequency may be properly determined while arranging the waveform of the microwaves.

Sixth Exemplary Embodiment

In the first exemplary embodiment, the success/failure of regulation of the oscillation frequency is determined. However, the success/failure of regulation of the oscillation frequency may be determined, and an abnormal oscillation of the magnetron 42 may also be determined. Thus, in the sixth exemplary embodiment, descriptions will be made on an example in which the success/failure of regulation of the oscillation frequency is determined and the abnormal oscillation of the magnetron 42 is also determined. In the following description, the components which are the same as those of the first exemplary embodiment will be denoted with the same symbols and descriptions thereof will be omitted.

Figure 15:
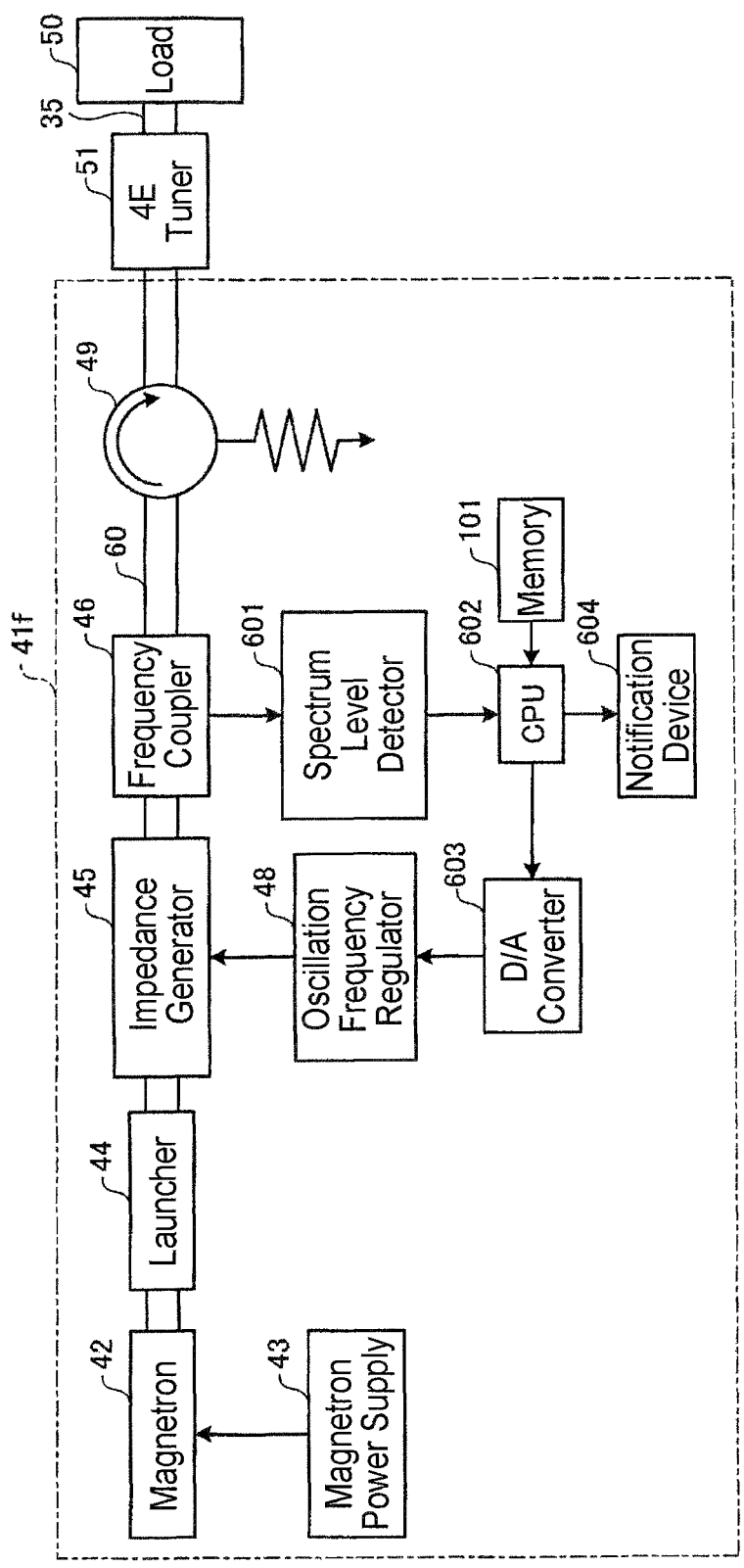
FIG. 15 is a block diagram illustrating a configuration of a microwave generator according to a sixth exemplary embodiment.

FIG. 15 is a block diagram illustrating a configuration of the microwave generator according to the sixth exemplary embodiment. The microwave generator 41f illustrated in FIG. 15 includes a spectrum level detector 601, a central processing unit (CPU) 602, a digital/analog (D/A) converter 603, and a notification device 604, instead of the frequency comparator 102 and the notification device 103 illustrated in FIG. 3.

The frequency coupler 46 is connected to the output terminal of the impedance generator 45 and branches microwaves traveling within the waveguide 60 from the impedance generator 45 toward the load 50 side, in which the frequency coupler 46 outputs one side of branched microwaves (hereinafter, referred to as "branched microwaves") to the spectrum level detector 601 and outputs the other side of branched microwaves to the circulator 49.

The oscillation frequency regulator 48 regulates the oscillation frequency of the magnetron 42 to the target frequency. Specifically, the oscillation frequency regulator 48 calculates a difference between the oscillation frequency input from the D/A converter 603 and the target frequency, and sets a protrusion position of a stub, which reduces the difference, in the impedance generator 45, thereby regulating the oscillation frequency of the magnetron 42 to the target frequency.

The spectrum level detector 601 detects an intensity distribution of the branched microwaves input from the frequency coupler 46 (hereinafter, referred to as an "intensity distribution") in relation to the frequency of the branched microwaves, and outputs the detected intensity distribution to the CPU 602 as a detection result.

The CPU 602 receives the input of the intensity distribution from the spectrum level detector 601. The CPU 602 detects a frequency corresponding to the maximum value in the intensity distribution as the oscillation frequency of the magnetron 42. The spectrum level detector 601 and the CPU 602 form an example of a detection unit that detects an oscillation frequency regulated to a predetermined frequency. The CPU 602 outputs the detected oscillation frequency to the D/A converter 603.

In addition, the CPU 602 determines the success/failure of regulation of the oscillation frequency by the oscillation frequency regulator 48 based on the detected oscillation frequency. Specifically, it is determined whether the detected oscillation frequency exists in the frequency band for determination which is stored in the memory 101. When the oscillation frequency exists in the frequency band for determination, the protrusion position of the stub, which is set in the impedance generator 45 from the oscillation frequency regulator 48, is accommodated between the lower limit position and the upper limit position. Thus, when the detected oscillation frequency exists in the frequency band for determination, the CPU 602 determines that the regulation of the oscillation frequency by the oscillation frequency regulator 48 has been successful. Meanwhile, when the oscillation frequency does not exist in the frequency band for determination, the protrusion position of the stub, which is set in the impedance generator 45 from the oscillation frequency regulator 48, reaches the lower limit position or the upper limit position. Thus, the CPU 602 determines that the regulation of the oscillation frequency by the oscillation frequency regulator 48 has not been successful. Subsequently, the CPU 602 outputs the determination result to the notification device 604. The CPU 602 is an example of a determination unit that determines the success/failure of regulation of an oscillation frequency using the detected oscillation frequency.

In addition, the CPU 602 calculates differences between the maximum value in the intensity distribution and peripheral values corresponding to opposite ends of a predetermined frequency band centered on a frequency corresponding to the maximum value, and determines the abnormal oscillation of the magnetron 42 based on the values of the calculated differences. The abnormal oscillation of the magnetron 42 refers to a phenomenon that the waveform of the microwaves oscillated by the magnetron 42 is disturbed.

Here, descriptions will be made on details of the processing of determining the abnormal oscillation of the magnetron 42 which is performed by the CPU 602. The CPU 602 determines whether the values of differences (hereinafter, referred to as "intensity differences") between the maximum value in the intensity distribution and the peripheral values corresponding to the opposite ends of the predetermined frequency band centered on the frequency of the maximum value is not more than a threshold. When the abnormal oscillation of the magnetron 42 is generated, the disturbance of the waveform of the microwaves from the magnetron 42 is caused and thus, the maximum value in the intensity distribution and the peripheral values corresponding to the opposite ends of the predetermined frequency band centered on the frequency corresponding to the maximum value in the intensity distribution approach to each other. As the disturbance degree increases, the approach degree of the maximum value and the peripheral values in the intensity distribution increases. In order to determine the approach degree between the maximum value and the peripheral values, the CPU 602 determines whether the values of the intensity differences are not more than the predetermined threshold.

When the values of the intensity differences exceed the threshold, the approach degree of the maximum value and the peripheral values in the intensity distribution is relatively small. Thus, the CPU 602 determines that no abnormal oscillation of the magnetron 42 is generated. Meanwhile, when the intensity differences are not more than the threshold, the approach degree of the maximum value and the peripheral values in the intensity distribution is relatively large. Thus, the CPU 602 determines that an abnormal oscillation of the magnetron 42 is generated. In addition, the CPU 602 outputs the determination result to the notification device 604.

The notification device 604 makes a notification of the determination result received from the CPU 602. For example, the notification device 604 makes the notification using, for example, a sound, light, and a vibration.

Figure 16:
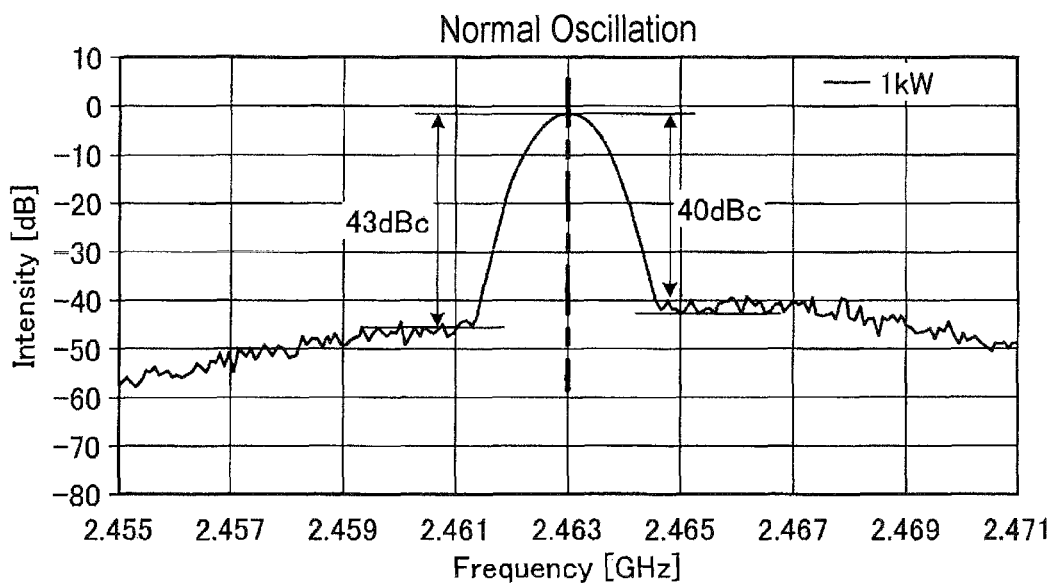
FIG. 16 is a view representing an intensity distribution in a case where no abnormal oscillation of a magnetron is generated.
Figure 17:
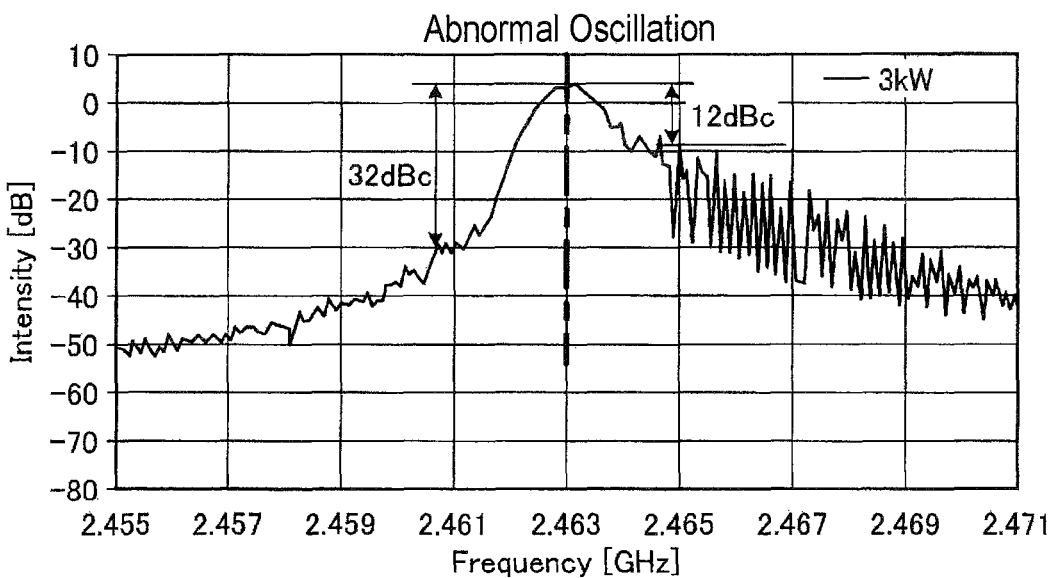
FIG. 17 is a view representing an intensity distribution in a case where an abnormal oscillation of a magnetron is generated.

Here, descriptions will be made on an example of a processing of determining the abnormal oscillation of the magnetron 42 by the CPU 602. FIG. 16 is a view representing an intensity distribution in a case where an abnormal oscillation of a magnetron is not generated. FIG. 17 is a view representing an intensity distribution in a case where an abnormal oscillation of a magnetron is generated. In FIGS. 16 and 17, the horizontal axes represent frequency [GHz], and the vertical axes represent intensity of branched microwaves [dB].

When no abnormal oscillation is generated, the values of intensity differences between the maximum value in the intensity distribution and the peripheral values corresponding to the opposite ends of a frequency band of ±2 (MHz) centered on the frequency of "2.463 (GHz)" corresponding to the maximum value are 43 dBc and 40 dBc, as illustrated in FIG. 16. Whereas, when an abnormal oscillation is generated, the values of intensity differences between the maximum value in the intensity distribution and the peripheral values corresponding to the opposite ends of the frequency band of ±2 (MHz) centered on the frequency of "2.463 (GHz)" corresponding to the maximum value are 32 dBc and 12 dBc, as illustrated in FIG. 17. That is, when the abnormal oscillation was generated, the intensity difference values were reduced as compared to the case when no abnormal oscillation was generated. Thus, in the example illustrated in FIGS. 16 and 17, when the intensity difference value is, for example, not more than 35 (dBc), it is understood that the abnormal oscillation of the magnetron 42 is generated. Thus, when the intensity difference is not more than 35 (dBc) as an example of the threshold, the CPU 602 determines that the abnormal oscillation of the magnetron 42 is generated.

As described above, the plasma processing apparatus 11 of the sixth exemplary embodiment determines the success/failure of regulation of the oscillation frequency, and also determines the abnormal oscillation of the magnetron 42. As a result, according to the sixth exemplary embodiment, the success/failure of regulation of the oscillation frequency and the abnormal oscillation of the magnetron may be compositely determined.

Seventh Exemplary Embodiment

In the sixth exemplary embodiment, the success/failure of regulation of the oscillation frequency is determined and the abnormal oscillation of the magnetron 42 is also determined. However, the success/failure of regulation of the waveform of microwaves may be determined and the abnormal oscillation of the magnetron 42 may also be determined while introducing a signal which arranges the waveform of the microwaves into the magnetron 42. Thus, in the seventh exemplary embodiment, descriptions will be made on an example in the success/failure of regulation of the oscillation frequency is determined and the abnormal oscillation of the magnetron 42 is also determined while introducing a signal which arranges the waveform of microwaves into the magnetron 42. In the following description, the components which are the same as those of the sixth exemplary embodiment will be denoted with the same symbols and descriptions thereof will be omitted.

Figure 18:
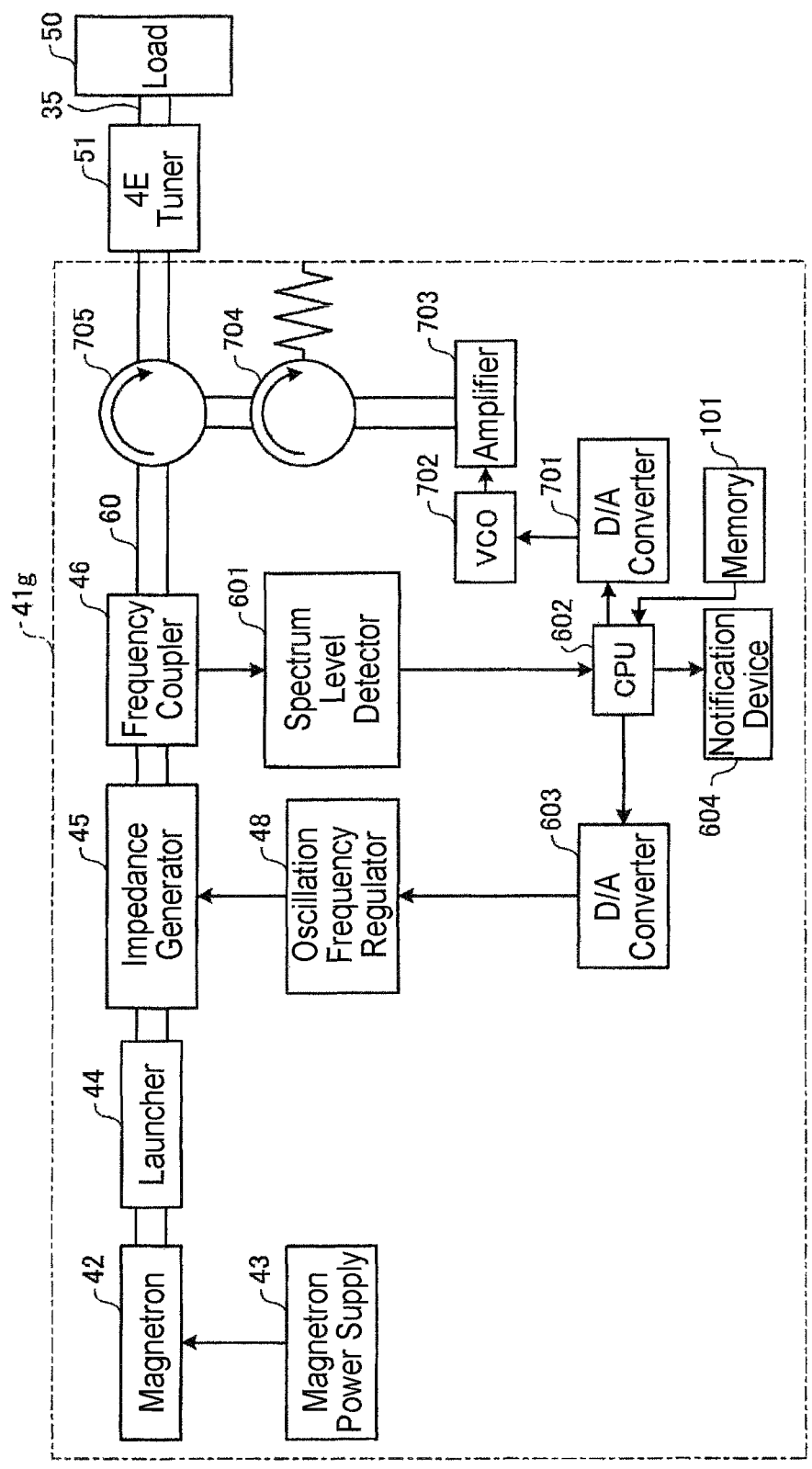
FIG. 18 is a block diagram illustrating a configuration of a microwave generator according to a seventh exemplary embodiment.

FIG. 18 is a block diagram illustrating a configuration of a microwave generator according to a seventh exemplary embodiment. The microwave generator 41g illustrated in FIG. 18 further includes a D/A converter 701, a VCO 702, and an amplifier 703 in addition to the respective components illustrated in FIG. 15. Further, the microwave generator 41g includes a circulator 704 and a circulator 705, instead of the circulator 49 illustrated in FIG. 15.

Like the CPU 602 illustrated in FIG. 15, the CPU 602 receives an input of an intensity distribution from the spectrum level detector 601. The CPU 602 detects a frequency corresponding to the maximum value in the intensity distribution as the oscillation frequency of the magnetron 42. The spectrum level detector 601 and the CPU 602 form an example of a detection unit that detects an oscillation frequency regulated to a predetermined frequency. The CPU 602 outputs the detected oscillation frequency to the D/A converter 603 and the D/A converter 701.

The D/A converter 701 performs D/A conversion on the value of the oscillation frequency input from the CPU 602, and outputs the value of the converted oscillation frequency to the VCO 702.

The VCO 702 oscillates a signal having a frequency equal to the oscillation frequency input from the D/A converter 701, and outputs the oscillated signal to the amplifier 703.

The amplifier 703 amplifies the signal input from the VCO 702 to generate a signal having a frequency equal to the oscillation frequency and a power lower than that of the microwaves oscillated by the magnetron 42, and outputs the generated signal to the circulator 704.

The circulator 704 transmits the signal input from the amplifier 703 (hereinafter, referred to as a "reference signal") to the circulator 705, and causes the microwaves reflected from the load 50 side to be absorbed to a dummy load.

The circulator 705 introduces the reference signal transmitted by the circulator 704 into the magnetron 42 through the waveguide 60. The waveform of the microwaves oscillated from the magnetron 42 is arranged by the reference signal introduced into the magnetron 42. The D/A converter 701, the VCO 702, the amplifier 703, the circulator 704, and the circulator 705 form an example of an introduction unit that introduces a signal having a frequency equal to the oscillation frequency and a power lower than that of the microwaves oscillated by the microwave oscillator.

As described above, the plasma processing apparatus 11 of the seventh exemplary embodiment determines the success/failure of regulation of an oscillation frequency and also determines the abnormal oscillation of the magnetron 42 while introducing a signal that arranges the waveform of the microwaves. As a result, according to the seventh exemplary embodiment, the success/failure of regulation of the oscillation frequency and the abnormal oscillation of the magnetron 42 may be compositely determined while arranging the waveform of the microwaves.

Eighth Exemplary Embodiment

In the sixth exemplary embodiment, the success/failure of regulation of the oscillation frequency is determined and the abnormal oscillation of the magnetron 42 is also determined. However, the success/failure of regulation of the oscillation frequency may be determined and the abnormal oscillation of the magnetron 42 may also be determined while introducing a reference signal that has a frequency equal to the target frequency and arranges the waveform of the microwaves into the magnetron 42. Thus, in the eighth exemplary embodiment, descriptions will be made on an example in which the success/failure of regulation of the oscillation frequency is determined and the abnormal oscillation of the magnetron 42 is also determined while introducing a reference signal that has a frequency equal to the target frequency and arranges the waveform of the microwaves into the magnetron 42. In the following description, the components which are the same as those of the sixth exemplary embodiment will be denoted with the same symbols and descriptions thereof will be omitted.

Figure 19:
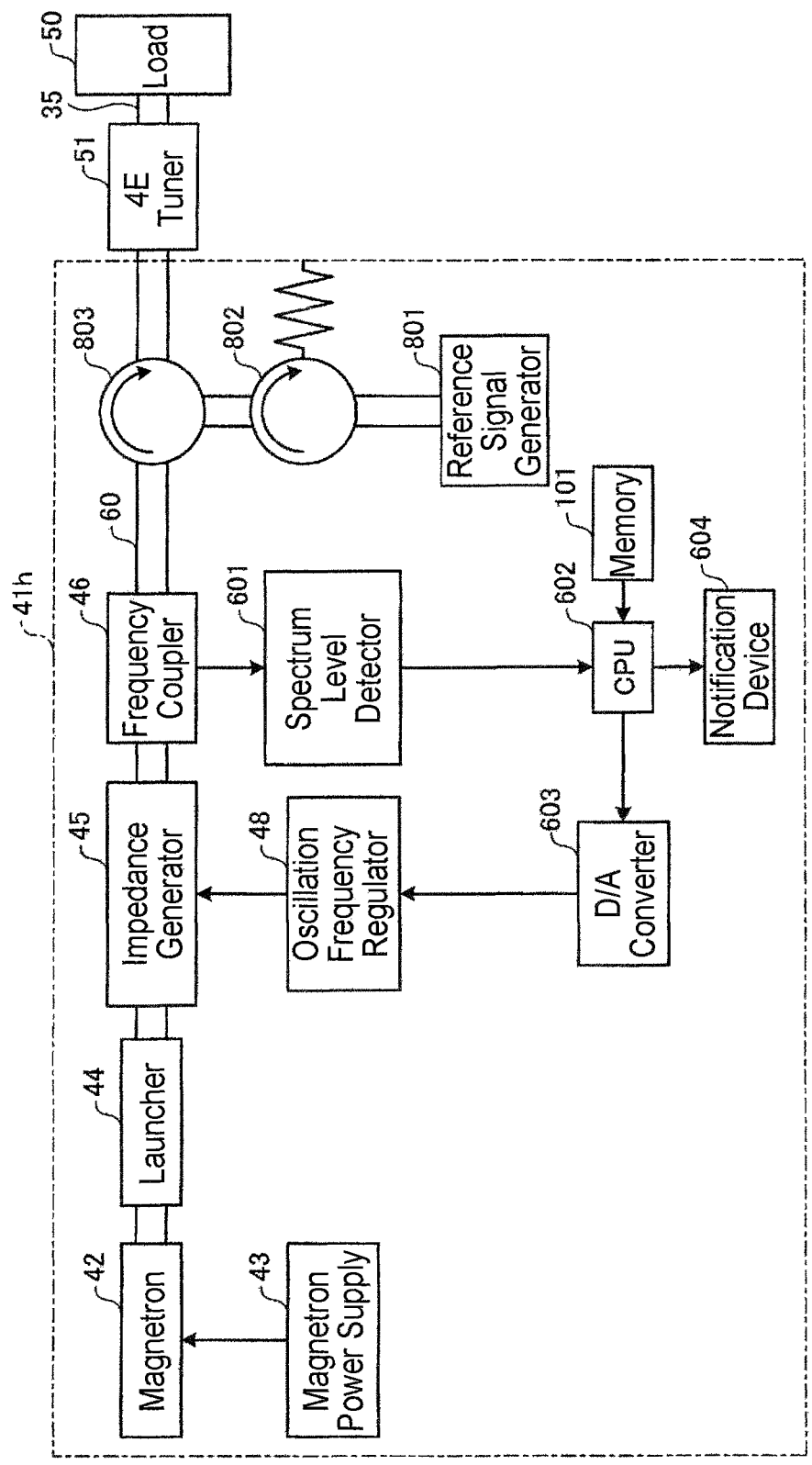
FIG. 19 is a block diagram illustrating a configuration of a microwave generator according to an eighth exemplary embodiment.

FIG. 19 is a block diagram illustrating a configuration of a microwave generator according to an eighth exemplary embodiment. The microwave generator 41h illustrated in FIG. 19 includes a reference signal generator 801, a circulator 802, and a circulator 803, instead of the circulator 49 illustrated in FIG. 15.

The memory 101 stores a frequency band for determination which is used for determining the success/failure of regulation of the oscillation frequency of the magnetron 42. The frequency band for determination for the present exemplary embodiment refers to a predetermined frequency band centered on a reference signal generated from the reference signal generator 801 to be described later.

The reference signal generator 801 generates a reference signal that has a frequency equal to the target frequency and a power lower than that of the microwaves oscillated by the magnetron 42. The reference signal generator 801 generates the reference signal by amplifying a signal stably oscillated from, for example, a quartz oscillator. Here, the power of the reference signal may be set to a power which is not more than 1/a predetermined value of the power of the microwaves oscillated by the magnetron 42. For example, the power of the reference signal may be set to be not more than 1/50 of the power of the microwaves oscillated by the magnetron 42. This is because when the power of the reference signal exceeds 1/50 of the power of the microwaves oscillated by the magnetron 42, an abnormal oscillation of the magnetron 42 is likely to occur.

Figure 20:
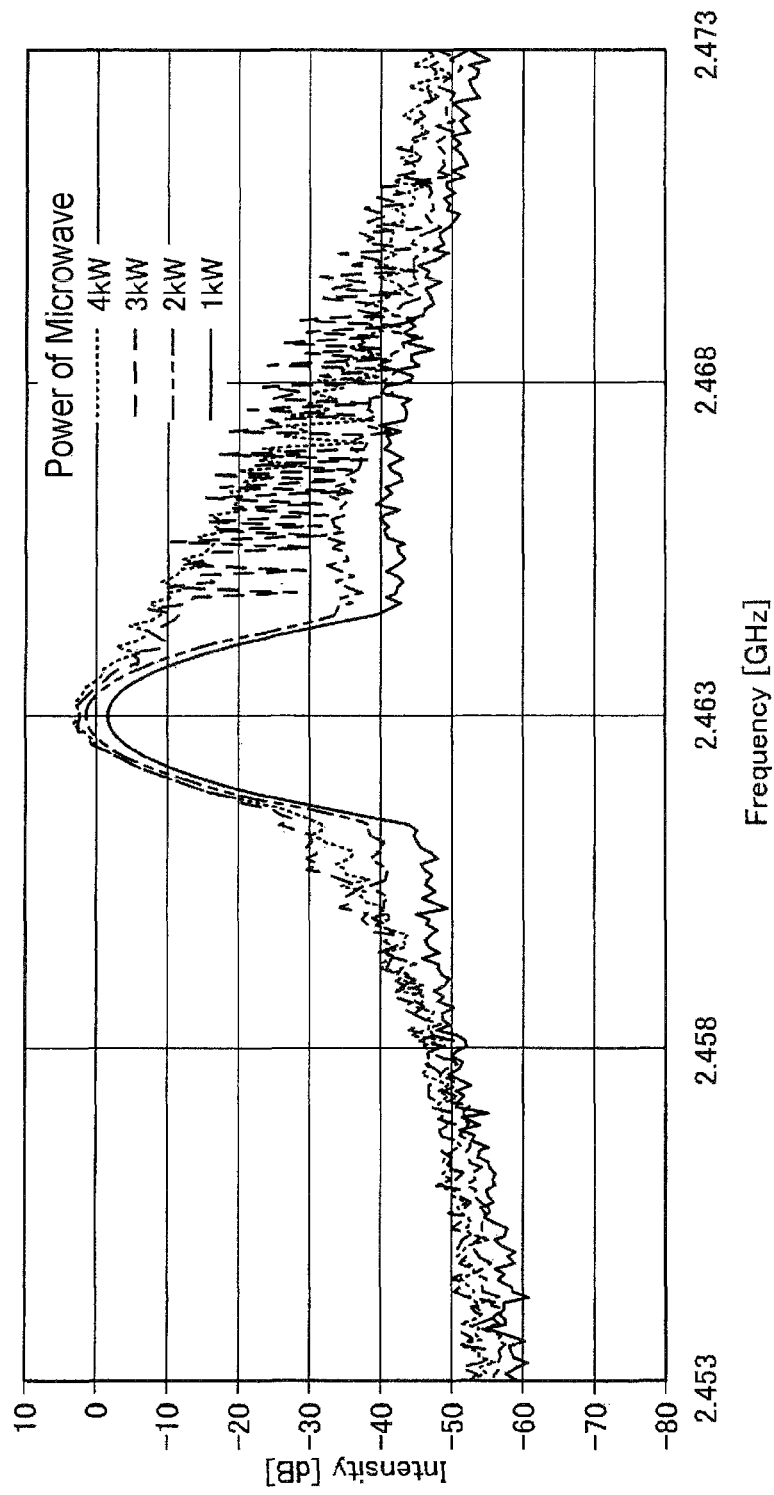
FIG. 20 is a view for describing a relation between a power of a reference signal and an abnormal oscillation of a magnetron.

FIG. 20 is a view for describing a relationship between a power of a reference signal and an abnormal oscillation of a magnetron. FIG. 20 represents a frequency characteristic of the magnetron 42. In FIG. 20, the horizontal axis represents frequency [GHz], and the vertical axis represents intensity [dB] of microwaves oscillated by the magnetron 42. In addition, FIG. 20 also illustrates power [kW] of the microwaves oscillated by the magnetron 42. In the present example, it is assumed that the power of the reference signal is 40 (W).

As illustrated in FIG. 20, when the power of the microwaves oscillated by the magnetron 42 is 3 [kW], and when the power of the microwaves oscillated by the magnetron 42 is 4 [kW], the power of the reference signal exceeds 1/50 of the power of the microwaves. In such cases, an abnormal oscillation of the magnetron 42 was generated.

Whereas, when the power of the microwaves oscillated by the magnetron 42 is 1 [kW], and when the power of the microwaves oscillated by the magnetron 42 is 2 [kW], the power of the reference signal is not more than 1/50 of the power of the microwaves. In such cases, no abnormal oscillation of the magnetron 42 was generated. As can be seen from the example of FIG. 20, the power of the reference signal may be set to a power which is not more than 1/a predetermined value of the power of the microwaves oscillated by the magnetron 42. For example, the power of the reference may be set to be not more than 1/50 of the power of the microwaves oscillated by the magnetron 42.

Descriptions will be made returning back to FIG. 19. Like the CPU 602 illustrated in FIG. 15, the CPU 602 receives an input of an intensity distribution from the spectrum level detector 601. The CPU 602 detects the frequency corresponding to the maximum value in the intensity distribution as the oscillation frequency of the magnetron 42. The spectrum level detector 601 and the CPU 602 form an example of a detection unit that detects an oscillation frequency regulated to a predetermined frequency. The CPU 602 outputs the detected oscillation frequency to the D/A converter 603.

In addition, like the CPU 602 illustrated in 15, the CPU 602 determines the success/failure of regulation of the oscillation frequency by the oscillation frequency regulator 48 based on the detected oscillation frequency.

In addition, like the CPU 602 illustrated in FIG. 15, the CPU 602 calculates differences between the maximum value in the intensity distribution and the peripheral values corresponding to the opposite ends of a predetermined frequency band centered on the frequency corresponding to the maximum value in the intensity distribution, and determines an abnormal oscillation of the magnetron 42 based on the values of calculated differences.

The circulator 802 transmits the reference signal generated from the reference signal generator 801 to the circulator 803, and causes the microwaves reflected from the load 50 side to be absorbed to a dummy load.

The circulator 803 introduces the reference signal transmitted by the circulator 802 into the magnetron 42 through the waveguide 60. The waveform of the microwaves oscillated from the magnetron 42 is arranged by the reference signal introduced into the magnetron 42. In addition, the frequency of the microwaves oscillated from the magnetron 42, that is, the oscillation frequency is drawn and regulated to the target frequency which is introduced into the magnetron 42. The reference signal generator 801, the circulator 802, and the circulator 803 form a regulation unit that regulates an oscillation frequency to a predetermined frequency by introducing the reference signal generated by the reference signal generator 801 into the magnetron 42.

As described above, the plasma processing apparatus 11 of the eighth exemplary embodiment determines the success/failure of regulation of an oscillation frequency and also determines the abnormal oscillation of the magnetron 42 while introducing a reference signal that has a frequency equal to the target frequency and arranges the waveform of microwaves into the magnetron 42. As a result, according to the eighth exemplary embodiment, the success/failure of regulation of the oscillation frequency and the abnormal oscillation of the magnetron 42 may be compositely determined while arranging the waveform of the microwaves.

Figure 21:
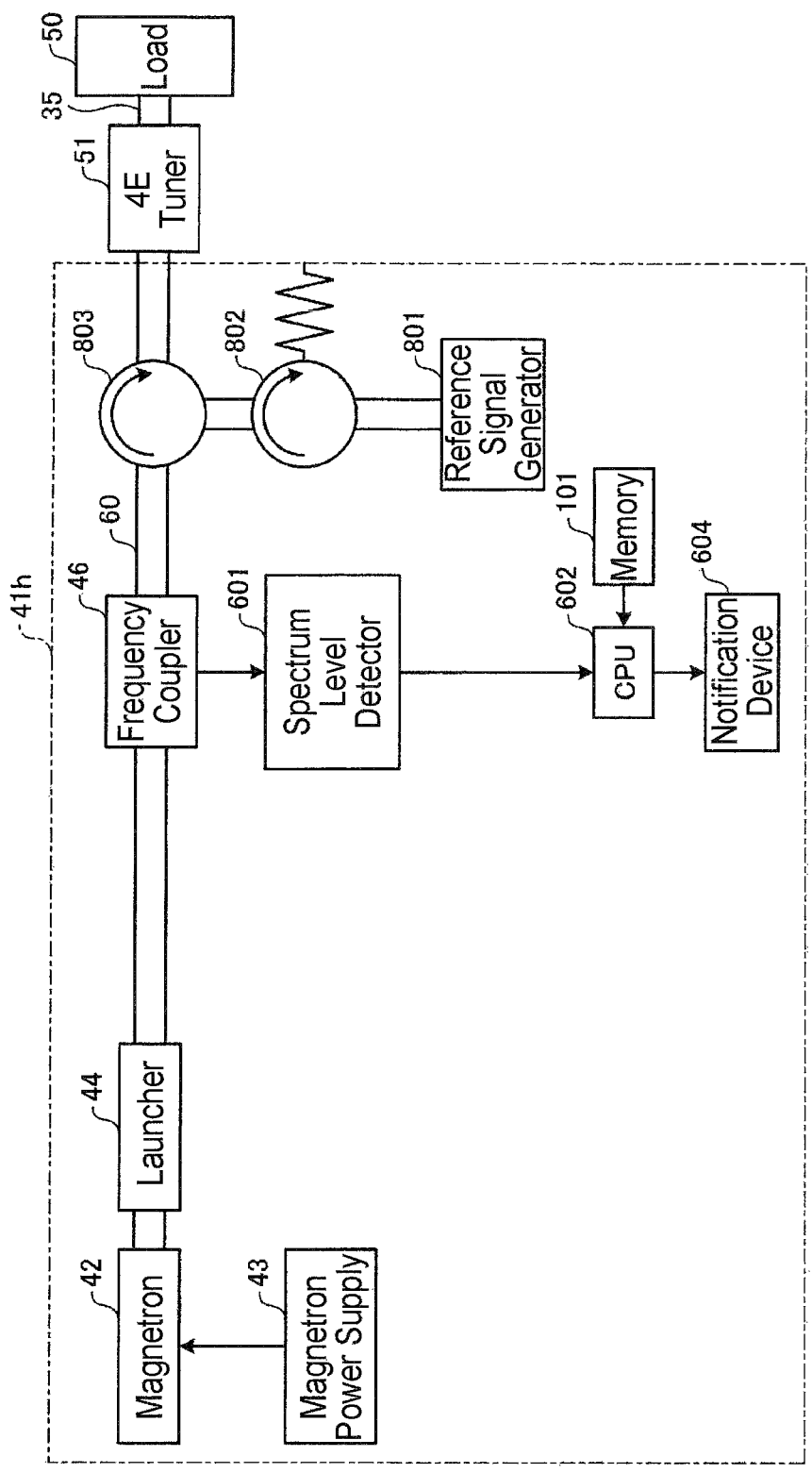
FIG. 21 is a block diagram illustrating a configuration of a modified example of the microwave generator according to the eighth exemplary embodiment.

Meanwhile, although an example in which the impedance generator 45 is equipped has been described in the eighth exemplary embodiment, exemplary embodiments are not limited thereto. For example, the impedance generator 45 may be omitted. In such a case, the microwave generator 41*h* may have the configuration illustrated in FIG. 21. Meanwhile, FIG. 21 is a block diagram illustrating a configuration of a modified example of the microwave generator according to the eighth exemplary embodiment.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A plasma processing apparatus comprising:
a processing container;
a microwave generator provided outside of the processing container and configured to generate microwaves, the microwave generator including:
a microwave oscillator configured to oscillate microwaves;
a regulator configured to regulate an oscillation frequency of the microwaves oscillated by the microwave oscillator, to a predetermined frequency; and
a detector connected to the regulator and configured to detect the oscillation frequency of the microwaves regulated to the predetermined frequency by the regulator; and a plasma generation mechanism including the microwave generator and configured to generate plasma within the processing container using the microwaves oscillated by the microwave oscillator of the microwave generator; and
a controller coupled to a memory and configured to control an overall operation of the plasma processing apparatus including the microwave generator and,
wherein the controller is configured to:
(i) determine that the regulation of the oscillation frequency by the regulator has been successful when the oscillation frequency detected by the detector exists within a predetermined frequency band centered at the predetermined frequency regulated by the regulator, and wherein the memory stores data indicating the predetermined frequency band centered at the predetermined frequency; and
(ii) determine that the regulation of the oscillation frequency by the regulator has failed when the oscillation frequency detected by the detector exists outside the predetermined frequency band centered at the predetermined frequency regulated by the regulator.

2. The plasma processing apparatus of claim 1, wherein the microwave generator further includes an impedance generator including a movable member, and configured to generate an impedance to be applied to the microwave oscillator depending on a movable amount set in the movable member, and
the regulator is configured to regulate the oscillation frequency of the microwave oscillator to the predetermined frequency by setting the movable amount of the movable member in the impedance generator, which reduces the difference between the oscillation frequency detected by the detector and the predetermined frequency.

3. The plasma processing apparatus of claim 2, wherein the regulator is configured to:
receive the oscillation frequency detected by the detector; and
set the position of the movable member in response to the oscillation frequency detected by the detector to regulate the oscillation frequency, and
wherein the controller is configured to determine whether the regulation of the oscillation frequency has been performed by the regulator, and after confirming that the regulation of the oscillation frequency has been performed by the regulator, to determine whether the regulation of the oscillation frequency by the regulator has been successful or has failed.

4. The plasma processing apparatus of claim 1, wherein the microwave generator further includes an impedance generator including a movable member, and configured to generate an impedance to be applied to the microwave oscillator depending on a movable amount set in the movable member, and
the regulator is further configured to regulate the oscillation frequency of the microwave oscillator to the predetermined frequency by setting the movable amount of the movable member in the impedance generator, which reduces the difference between the oscillation frequency detected by the detector and the predetermined frequency, and
wherein the controller is further configured to:
(i) determine that the regulation of the oscillation frequency by the regulator has been successful when the movable amount of the movable member, which is set in the impedance generator as the parameter by the regulator, exists within an allowed positional range, and (ii) determine that the regulation of the oscillation frequency by the regulator is failed when the movable amount of the movable member, which is set in the impedance generator as the parameter by the regulator, exists outside the allowed positional range.

5. The plasma processing apparatus of claim 4, wherein the movable member includes a stub and the allowed positional range is set to a range of 0 mm to 20 mm.

6. The plasma processing apparatus of claim 1, further comprising:
an introduction unit including one of a voltage controlled oscillator, an amplifier and a circulator and configured to introduce a signal, which has a frequency equal to the oscillation frequency and a power lower than a power of the microwaves oscillated by the microwave oscillator, into the microwave oscillator.

7. The plasma processing apparatus of claim 1, wherein the regulator includes a reference signal generator configured to generate a reference signal, which has the predetermined frequency and a power lower than a power of the microwaves oscillated by the microwave oscillator, and the regulator regulates the oscillation frequency to the predetermined frequency by introducing the reference signal generated by the reference signal generator into the microwave oscillator.

8. The plasma processing apparatus of claim 1, wherein the detector includes a spectrum level detector configured to detect an intensity distribution of branched microwaves obtained when the microwaves are branched by the microwave oscillator with respect to a frequency of the branched microwaves, the detector detecting a frequency corresponding to a maximum value in the intensity distribution as the oscillation frequency, and
the controller determines the success/failure of regulation of the oscillation frequency by the regulator using the oscillation frequency detected by the detector, and also determines an abnormal oscillation of the microwave oscillator by calculating differences between the maximum value in the intensity distribution detected by the detector and peripheral values corresponding to opposite ends of a predetermined frequency band centered on a frequency corresponding to the maximum value, and using values of the calculated differences.

9. The plasma processing apparatus of claim 1, wherein the controller is further configured to make a notification of a determination result of whether the regulation of the oscillation frequency by the regulator has been successful or has failed.

10. The plasma processing apparatus of claim 1, wherein the oscillation frequency of the microwave oscillator is changed according to a change of the impedance applied to the microwave oscillator.

11. The plasma processing apparatus of claim 1, wherein the regulator is configured to:
receive the oscillation frequency detected by the detector; and
regulate the oscillation frequency in response to the oscillation frequency detected by the detector, and
wherein the controller is configured to determine whether the regulation of the oscillation frequency has been performed by the regulator, and after confirming that the regulation of the oscillation frequency has been performed by the regulator, to determine whether the regulation of the oscillation frequency by the regulator has been successful or has failed.

12. The plasma processing apparatus of claim 1, wherein the controller is configured to determine that the regulation of the oscillation frequency by the regulator has been successful when the oscillation frequency exists within the predetermined frequency band regardless of a deviation of the oscillation frequency from the predetermined frequency within the predetermined frequency band.

13. An abnormality determination method comprising:
providing a plasma processing apparatus including:
a processing container;
a microwave generator provided outside of the processing container and configured to generate microwaves, the microwave generator including:
a microwave oscillator configured to oscillate microwaves;
a regulator configured to regulate an oscillation frequency of the microwaves oscillated by the microwave oscillator to a predetermined frequency; and
a detector connected to the regulator and configured to detect the oscillation frequency of the microwaves regulated to the predetermined frequency by the regulator; and
a plasma generation mechanism including the microwave generator and configured to generate plasma within the processing container using the microwaves oscillated by the microwave oscillator of the microwave generator; and
a controller coupled to a memory and configured to control an overall operation of the plasma processing apparatus including the microwave generator,
regulating, by the regulator, the oscillation frequency of the microwaves oscillated by the microwave oscillator to the predetermined frequency;
detecting, by the detector, the oscillation frequency of the microwaves regulated to the predetermined frequency by the regulator;
determining, by the controller, that the regulation of the oscillation frequency by the regulator has been successful when the oscillation frequency detected by the detector exists within a predetermined frequency band centered at the predetermined frequency regulated by the regulator, wherein the memory stores data indicating the predetermined frequency band centered at the predetermined frequency; and
determining, by the controller, that the regulation of the oscillation frequency by the regulator is failed when the oscillation frequency detected by the detector exists outside the predetermined frequency band centered at the predetermined frequency regulated by the regulator.

14. The abnormality determination method of claim 13, wherein the regulating includes changing the oscillation frequency of the microwave oscillator according to a change of the impedance applied to the microwave oscillator.

15. The abnormality determination method of claim 13, further comprising:
regulating by the regulator the oscillation frequency in response to the oscillation frequency detected by the detector,
wherein the controller determines whether the regulation of the oscillation frequency has been performed by the regulator, and after it is determined that the regulation of the oscillation frequency by the regulator has been performed, the controller determines whether the regulation of the oscillation frequency by the regulator has been successful or has failed.

16. The abnormality determination method of claim 13, wherein it is determined that the regulation of the oscillation frequency by the regulator has been successful when the oscillation frequency exists within the predetermined frequency band regardless of a deviation of the oscillation frequency from the predetermined frequency within the predetermined frequency band.

17. A microwave generator comprising:
a microwave oscillator configured to oscillate microwaves;
a regulator configured to regulate an oscillation frequency of the microwaves oscillated by the microwave oscillator, to a predetermined frequency;
a detector connected to the regulator and configured to detect the oscillation frequency of the microwaves regulated to the predetermined frequency by the regulator; and
a comparator coupled to a memory and connected to the detector,
wherein the comparator is configured to:
(i) determine that the regulation of the oscillation frequency by the regulator has been successful when the oscillation frequency detected by the detector exists within a predetermined frequency band centered at the predetermined frequency regulated by the regulator, wherein the memory stores data indicating the predetermined frequency band centered at the predetermined frequency, and
(ii) determine that the regulation of the oscillation frequency by the regulator has failed when the oscillation frequency detected by the detector exists outside the predetermined frequency band centered at the predetermined frequency regulated by the regulator.

18. The microwave generator of claim 17, wherein the oscillation frequency of the microwave oscillator is changed according to a change of the impedance applied to the microwave oscillator.

19. The microwave generator of claim 17, wherein the regulator is configured to:
receive an oscillation frequency detected by the detector; and
regulate the oscillation frequency in response to the oscillation frequency detected by the detector; and
wherein the comparator is configured to determine whether the regulation of the oscillation frequency has been performed by the regulator, and after confirming that the regulation of the oscillation frequency has been performed by the regulator, to determine whether the regulation of the oscillation frequency by the regulator has been successful or has failed.

20. The microwave generator of claim 17, wherein the comparator is configured to determine that the regulation of the oscillation frequency by the regulator has been successful when the oscillation frequency exists within the predetermined frequency band regardless of a deviation of the oscillation frequency from the predetermined frequency within the predetermined frequency band.

* * * * *